(12) United States Patent
Nishijima et al.

(10) Patent No.: US 9,111,920 B2
(45) Date of Patent: Aug. 18, 2015

(54) SEMICONDUCTOR DEVICE

(71) Applicant: PANASONIC CORPORATION, Osaka (JP)

(72) Inventors: Masaaki Nishijima, Osaka (JP); Tsuyoshi Tanaka, Osaka (JP)

(73) Assignee: PANASONIC INTELLECTUAL PROPERTY CO., LTD., Osaka (JP)

( * ) Notice: Subject to any disclaimer, the term of this patent is extended or adjusted under 35 U.S.C. 154(b) by 0 days.

(21) Appl. No.: 13/963,804

(22) Filed: Aug. 9, 2013

(65) Prior Publication Data

US 2013/0320496 A1    Dec. 5, 2013

Related U.S. Application Data

(63) Continuation of application No. PCT/JP2011/003580, filed on Jun. 23, 2011.

(30) Foreign Application Priority Data

Mar. 9, 2011    (JP) .................................. 2011-051138

(51) Int. Cl.
*H01L 23/495*    (2006.01)

(52) U.S. Cl.
CPC .......... *H01L 23/495* (2013.01); *H01L 23/4952* (2013.01); *H01L 23/49551* (2013.01); *H01L 23/49562* (2013.01); *H01L 2224/32245* (2013.01); *H01L 2224/48247* (2013.01); *H01L 2224/73265* (2013.01);
(Continued)

(58) Field of Classification Search
CPC ....... H01L 23/48; H01L 23/495; H01L 21/50; H01L 21/67144; H01L 21/4825; H01L 23/043; H01L 23/498

USPC .................. 257/690, 787, 676, 728, E23.02, 257/E21.502, 532, 672; 438/127, 106, 123
See application file for complete search history.

(56) References Cited

U.S. PATENT DOCUMENTS 3,763,403 A   10/1973   Lootens
4,963,975 A * 10/1990   Sawaya ......................... 257/669
(Continued)

FOREIGN PATENT DOCUMENTS

JP    48-102574 A    12/1973
JP    S-63-202049 A   8/1988
(Continued)

OTHER PUBLICATIONS

International Search Report issued in International Search Report with Date of mailing Sep. 13, 2011.

*Primary Examiner* — Jarrett Stark
*Assistant Examiner* — Shahed Ahmed
(74) *Attorney, Agent, or Firm* — McDermott Will & Emery LLP

(57) ABSTRACT

A semiconductor device includes: a die pad comprised of a metal, and having at least one cutout portion in its peripheral edge portion, and a protruding portion formed by the cutout portion so as to protrude laterally from the peripheral edge portion; an inner lead having at its end a bonding pad that is placed in the cutout portion with an interval between the bonding pad and the die pad; a semiconductor chip held on the die pad so that a center position of the semiconductor chip is located on the protruding portion side with respect to a center position of the die pad; and a wire configured to electrically connect the semiconductor chip to the bonding pad.

23 Claims, 35 Drawing Sheets

(52) U.S. Cl.
CPC ............... *H01L 2924/01322* (2013.01); *H01L 2924/1305* (2013.01); *H01L 2924/13062* (2013.01); *H01L 2924/13091* (2013.01); *H01L 2924/1423* (2013.01); *H01L 2924/19107* (2013.01); *H01L 2924/3011* (2013.01)

(56) References Cited

U.S. PATENT DOCUMENTS

| | | | |
|---|---|---|---|
| 5,859,387 A * | 1/1999 | Gagnon | 174/531 |
| 5,869,898 A * | 2/1999 | Sato | 257/728 |
| 6,252,306 B1 | 6/2001 | Ohgiyama et al. | |
| 6,534,878 B1 | 3/2003 | Sander et al. | |
| 7,375,424 B2 | 5/2008 | Connah | |
| 7,528,460 B2 * | 5/2009 | Nishimura et al. | 257/528 |
| 2001/0045627 A1 * | 11/2001 | Connah et al. | 257/666 |
| 2002/0084511 A1 | 7/2002 | Konishi | |
| 2006/0017141 A1 * | 1/2006 | Luo et al. | 257/666 |
| 2006/0151889 A1 * | 7/2006 | Kajiwara et al. | 257/787 |
| 2006/0249831 A1 * | 11/2006 | Connah | 257/690 |
| 2012/0080781 A1 * | 4/2012 | Li et al. | 257/676 |
| 2012/0086090 A1 * | 4/2012 | Sharma et al. | 257/421 |
| 2012/0156832 A1 * | 6/2012 | Li et al. | 438/123 |
| 2013/0171776 A1 * | 7/2013 | Fukuhara et al. | 438/124 |

FOREIGN PATENT DOCUMENTS

| | | |
|---|---|---|
| JP | H-01-205453 A | 8/1989 |
| JP | 04-320054 A | 11/1992 |
| JP | H-06-163786 A | 6/1994 |
| JP | 11-260992 A | 9/1999 |
| JP | H-11-330313 A | 11/1999 |
| JP | 2000-503491 A | 3/2000 |
| JP | 2000-150763 * | 5/2000 |
| JP | 2002-203957 A | 7/2002 |
| JP | 2003-068960 A | 3/2003 |
| JP | 2004-119610 A | 4/2004 |
| JP | 2006-190850 A | 7/2006 |
| JP | 2008-541435 A | 11/2008 |

* cited by examiner

TOTAL GATE WIDTH (Wg)
= NUMBER OF UNITS (Nf)
× UNIT FINGER LENGTH (Lf)

PRIOA ART

PRIOA ART

SEMICONDUCTOR DEVICE

CROSS-REFERENCE TO RELATED APPLICATION

This is a continuation of PCT International Application PCT/JP2011/003580 filed on Jun. 23, 2011, which claims priority to Japanese Patent Application No. 2011-051138 filed on Mar. 9, 2011. The disclosures of these applications including the specifications, the drawings, and the claims are hereby incorporated by reference in their entirety.

BACKGROUND

The present invention relates to semiconductor devices using a lead frame for a resin-sealed package which is used in a microwave band, and more particularly to semiconductor devices that are applicable to power amplifiers.

Devices capable of implementing both high performance and low cost have been desired for microwave high-output power amplifiers. Transistors that are used for high-output power amplifiers typically tend to have lower high-frequency input/output impedance in the case of field effect transistors (FETs) because the gate width is increased. The actual resistance value is at most 2Ω to 3 Ω.

As the standard impedance is 50Ω in a high frequency circuit section in a set such as communication equipment etc., input/output terminals of the high-output power amplifier need be matched to 50Ω. In the case of converting the low impedance at the input/output terminals of the transistor to 50Ω, high frequency loss due to the low impedance is not caused FIG. 32A shows on a Smith chart an impedance conversion path and constituent elements that are used to attain 50Ω matching from an input impedance point of the transistor. By using the input impedance point of the transistor as a starting point, a series inductor element and a parallel capacitor element are sequentially connected in this order, and the impedance value of each element is appropriately selected, whereby the impedance can be converted to 50Ω. However, as shown in FIG. 32B, if the inductance value is too large or the capacitance value is too small or too large, the impedance is separated from the predetermined point of 50Ω, resulting in an impedance mismatch state.

As shown in FIG. 33A, a bonding wire 3 is typically used to connect a semiconductor chip including a transistor 1 to a lead 2 in a package 10. The lead 2 and the bonding wire 3 are represented by an equivalent circuit formed by a series inductance component and a parallel capacitance component. In this case, matching circuits 11 are provided on a board outside the package 10 so as to attain 50Ω input/output impedance matching.

As described above, if the transistor 1 has low input/output impedance, high frequency loss of the wire 3 itself becomes non-negligible as the wire 3 becomes longer. Such high frequency loss causes reduction in gain. As shown in FIG. 33B, in order to achieve 50Ω matching, a pre-matching circuit 5 having a pre-matching function is usually connected near the input/output terminal of the transistor 1 in order to increase an actual resistance component of the impedance. The pre-matching circuit 5 suppresses as much as possible the power loss that is caused by conversion of the impedance to high impedance. The pre-matching circuit 5 uses a configuration of a monolithic microwave integrated circuit (MMIC) in which the pre-matching circuit 5 is monolithically formed on the semiconductor chip where the transistor 1 is formed, or a hybrid configuration in which the pre-matching circuit 5 is formed on a separate semiconductor chip and is connected by a wire.

In terms of the manufacturing cost, it is desirable that high performance can be attained without using the MMIC and the hybrid composition.

Ceramic packages are typically used as packages for high-output power amplifiers. The ceramic packages are expensive although they have excellent high-frequency characteristics and heat dissipation characteristics. In order to reduce the cost, it is preferable to use resin-sealed packages it is acceptable in terms of their heat dissipation characteristics including heat resistance, although the resin-sealed packages are subjected to limitation by the specification such as the output power level and efficiency of the high-output power amplifier.

Semiconductor devices according to first and second conventional examples will be described with reference to FIGS. 34A and 34B (see, e.g., Japanese Translation of PCT International Application No. 2008-541435 (FIGS. 2 and 3) and U.S. Pat. No. 7,375,424 (FIGS. 2 and 3)).

As shown in FIG. 34A, the semiconductor device according to the first conventional example has a lead frame 102 having a die pad 104 and a plurality of terminal leads 110 to 118, and a device 101 fixed to the die pad 104. Bond pads 110a to 118a provided at the ends of the terminal leads 110 to 118 are arranged so as to adjoin the lower end of the die pad 104 and to cross the bottom of a device package. A source electrode 23, a drain electrode 22, and a gate electrode 20 of the device 101 are electrically connected to the terminal leads through a plurality of wire bonds 120, 121, etc. extending from a runner of each electrode to the bond pads 110a, 112a, etc.

As shown in FIG. 34B, the semiconductor device according to the second conventional example has a lead frame 202 having a die pad 204 and a plurality of terminal leads 210 to 214, and a device 201 fixed to the die pad 204. The bond pads 210a, 214a connected to elongated power electrodes 25, 26 of the device 201 by wire bonds 220, 222, etc. are arranged so as to extend adjacent to the opposing peripheral edges (side surfaces) of the die pad 204. That is, the bond pads 210a, 214a are arranged so as to extend parallel to the longitudinal direction of the power electrodes 25, 26 of the device 201 and adjacent to the power electrodes 25, 26 of the device 201.

With this configuration, the plurality of wire bonds 220 connecting the first power electrode 25 to the bond pad 210a and the plurality of wire bonds 222 connecting the second power electrode 26 to the bond pad 214a are arranged substantially parallel to each other and with substantially the same length along the power electrodes 25, 26 and the bond pads 210a, 214a.

A semiconductor device according to a third conventional example will be described with reference to FIGS. 35A-35C (see, e.g., Japanese Patent Publication No. 2004-119610 (FIG. 10)).

As shown in FIGS. 35A-35C, a lead frame includes a die pad portion 11 and a heat dissipation plate 12 which are formed by a thin plate portion, and a frame portion, a suspension lead portion 14, an external connection lead portion 15, and a tie bar portion which are formed by a thin plate portion. The suspension lead portion 14 is connected to an upper part of the die pad portion 11, and the end on the die pad portion 14 side of the suspension lead portion 14 is bent in a beak shape to form a heat conduction region 14b as a region where a part of the upper surface of the suspension lead portion 14 is located above the die pad portion 11.

The bent portion including the heat transmission portion 14b is bent such that the frame portion side of the suspension lead portion 14 is located above the upper surface of the die pad portion 11 and extends in a direction parallel to the upper surface of the die pad portion 11. This reduces the distance between the die pad portion 11 and the frame portion, and the external connection lead portion 15 connected to the suspension lead portion 14 by the frame portion and the tie bar portion has an overhang structure in which the end on the die pad portion 11 side of the external connection lead portion 15 overhangs the die pad portion 11. As a result, the end on the die pad portion 11 side of the external connection lead portion 15 serves as an inner lead portion 15a connected to a semiconductor chip 21, and the end on the frame side of the external connection lead portion 15 serves as an outer lead portion 15b connected to a mount substrate.

Since the end on the die pad portion 11 side of the external connection lead portion 15 overhangs the die pad portion 11, the distance to the semiconductor chip 21 can be reduced.

The semiconductor chip 21 is fixed to the upper surface of the die pad portion 11, and as shown in FIG. 35C, a plurality of element electrodes (not shown) of the semiconductor chip 21 are connected to the inner lead portion 15a via metal thin wires 22.

As shown in FIG. 35B, the suspension lead portion 14 is connected to the semiconductor chip 21 via a metal thin wire 22, so that a ground potential is supplied to the semiconductor chip 21.

The die pad portion 11 and the semiconductor chip 21 are integrally sealed by a resin sealing portion 23.

SUMMARY

However, the above conventional examples have the following problems. First, in the lead frame shown in FIG. 34A and the semiconductor device for high frequency applications using such a lead frame according to the first conventional example, if a high frequency transistor for high-output power amplifiers is mounted on the package shown in FIG. 34A, the length of the wire from each electrode of the device to each bond pad provided at the end of each lead is increased, and impedance of such a high frequency transistor is typically low. This increases a parasitic inductance component of the terminal lead itself. Since impedance at the end of the outer lead remains low, and is not converted to the high impedance side, it is difficult to achieve 50Ω matching. This increases high frequency loss from the ends (external terminals) of the device to the ends of the outer leads, thereby impairing the high frequency performance as a high-output power amplifier, namely reducing the gain.

In the lead frame shown in FIG. 34B and the semiconductor device for high frequency applications using such a lead frame according to the second conventional example, the bond pads are extended to the opposing peripheral edges of the die pad, and the wire bonds are arranged substantially parallel to each other along the electrodes and the bond pads. Moreover, the wires are connected at substantially regular intervals in the longitudinal direction of the leads. Accordingly, in terms of transmission of a high frequency signal from the device, a high frequency signal that is supplied to each electrode as an input terminal of the device is amplified with its phase being different between the electrodes. Furthermore, when the high frequency signal output from each electrode as an output terminal of the device is output from the bond pad, the high frequency signal having a different phase is superimposed thereon. This reduces the output power and gain as a high-output power amplifier, and impairs the high frequency performance.

Since the wires are connected to the bond pads extending to the peripheral edge of the die pad, the distance from the wire connection point to the inner lead portion to the end of the outer lead is increased even if the wire is connected to the inner lead portion at the shortest distance. This increases a parasitic inductance component. Thus, impedance at the end of the outer lead remains low, making it difficult to achieve 50Ω matching.

The configuration in which the bond pad is placed near the die pad as in FIG. 34B is also shown in FIG. 5 of Japanese Patent Publication No. S63-202049, FIG. 4 of Japanese Patent Publication No. H01-205453, FIGS. 1 and 3 of Japanese Patent Publication No. H04-320054, FIG. 4 of Japanese Patent Publication No. H11-260992, FIG. 15 of Japanese Patent Publication No. H11-330313, and FIG. 3 of Japanese Patent Publication No. 2002-203957. In these Japanese patent publications as well, even if the length of the wire connecting the bond pad to the device (semiconductor chip) is reduced, the length of the inner lead portion is increased, making it difficult to achieve 50Ω matching.

In the lead frame shown in FIGS. 35A-35B and the semiconductor device for high frequency applications using such a lead frame according to the third conventional example, the semiconductor chip is interposed between the inner lead portion and the upper surface of the die pad portion. It is difficult to perform such a mounting method of interposing the semiconductor chip between the inner lead portion and the die pad portion by using a normal die bonding method. In the case where a high frequency signal is transmitted to the inner lead portion, the reference potential of the high frequency signal is a ground potential at the upper surface of the die pad portion. Accordingly, if the semiconductor chip is interposed as described above, the waveform of the high frequency signal is disturbed by the insertion of the dielectric portion. Since this affects impedance matching of the high frequency signal to the semiconductor chip as a resin-sealed package, it is difficult to attain 50Ω matching by conversion from low impedance to the high impedance side. Moreover, the dielectric portion causes high frequency loss, thereby increasing high frequency loss from the semiconductor chip to the outer lead portion. This impairs the high frequency performance as a high-output power amplifier, namely reduces the gain.

FIG. 1 of Japanese Patent Publication No. H06-163786 does not show the mount position of the semiconductor chip.

The present invention was developed to solve the above problems, and it is an object of the present invention to implement a semiconductor device having a power amplifier capable of increasing output power and performing high gain operation.

In order to achieve the above object, the present invention is configured so that a cutout portion is provided in a die pad holding a semiconductor chip thereon, and a bonding pad as an end of an inner lead is placed in the cutout portion. As another configuration, the bonding pad as the end of the inner lead is placed above the die pad rather than above the semiconductor chip so as to overlap the die pad.

Specifically, a first semiconductor device according to the present invention includes: a die pad comprised of a metal, and having at least one cutout portion in its peripheral edge portion, and a protruding portion formed by the cutout portion so as to protrude laterally from the peripheral edge portion; a first inner lead having at its end a bonding pad that is placed in the cutout portion with an interval between the bonding pad and the die pad; a semiconductor chip held on the die pad so that a center position of the semiconductor chip is located on the protruding portion side with respect to a center position of the die pad; and a wire configured to electrically connect the semiconductor chip to the bonding pad.

The first semiconductor device includes: the die pad having the at least one cutout portion in its peripheral edge portion and the protruding portion formed by the cutout portion so as to protrude laterally from the peripheral edge portion; and the first inner lead having at its end the bonding pad that is placed in the cutout portion with the interval between the bonding pad and the die pad. This reduces the wire length from each electrode of the semiconductor chip to the bonding pad of the first inner lead, and thus can reduce a parasitic inductance component of the first inner lead itself. As a result, impedance at an end of an outer lead can be matched to 50Ω, whereby a power amplifier capable of increasing output power and operating high gain operation can be obtained.

In the first semiconductor device, the bonding pad may have an extended portion extending along a side surface of the die pad with an interval therebetween.

This allows the extended portion to function as an open-circuited stub (open stub).

In this case, the extended portion may be electrically connected to a part of the side surface of the die pad.

In this case, a ground potential may be applied to the die pad, and a capacitive element portion may be formed by the extended portion and the side surface of the die pad.

In this case, the extended portion may be electrically connected to the die pad by a wire.

This allows the extended portion to function as a short-circuited stub (short stub).

In this case, the semiconductor device may further include: a sealing resin material configured to seal the semiconductor chip, the die pad, and the first inner lead, and at least a part of a surface of the die pad which is located on an opposite side from a surface of the die pad on which the semiconductor chip is held may be exposed from the sealing resin material, and the extended portion may have a protruding part formed so as to be exposed from the sealing resin material.

The first semiconductor device may further include a second inner lead placed parallel to the first inner lead and extending with an interval between the second inner lead and a side surface of the die pad, and the second inner lead may be electrically connected to the bonding pad by a wire.

This allows the second inner lead to function as an open-circuited stub (open stub).

The first semiconductor device may further include: a second inner lead placed parallel to the first inner lead and extending with an interval between the second inner lead and a side surface of the die pad; and a sealing resin material configured to seal the semiconductor chip, the die pad, the first inner lead, and the second inner lead, the second inner lead may be electrically connected to the bonding pad by a wire, at least a part of a surface of the die pad which is located on an opposite side from a surface of the die pad on which the semiconductor chip is held may be exposed from the sealing resin material, and the second inner lead may have a protruding part formed so as to be exposed from the sealing resin material.

This allows the second inner lead to function as a short-circuited stub (short stub).

In the first semiconductor device, an upper surface of the die pad and an upper surface of the bonding pad may be located at the same height from a lower surface of the die pad, and the die pad may have a greater thickness than the inner leads.

In the first semiconductor device, the upper surface of the bonding pad may be located higher than the upper surface of the die pad, and the die pad may have the same thickness as the inner leads.

In the first semiconductor device, the cutout portion may have a planar shape corresponding to two sides of a quadrilateral, one side of a triangle, a concave circular arc, or a convex circular arc.

A second semiconductor device according to the present invention includes: a die pad comprised of a metal; a first inner lead having at its end a bonding pad that is placed above the die pad with an interval therebetween so as to overlap a part of the die pad; a semiconductor chip held on the die pad so that a center position of the semiconductor chip is located on the bonding pad side with respect to a center position of the die pad; and a wire configured to electrically connect the semiconductor chip to the bonding pad.

The second semiconductor device includes: the die pad comprised of a metal; and the first inner lead having at its end a bonding pad that is placed above the die pad with an interval therebetween so as to overlap a part of the die pad. This reduces the wire length from each electrode of the semiconductor chip to the bonding pad of the first inner lead, and thus can reduce a parasitic inductance component of the first inner lead itself. As a result, impedance at an end of an outer lead can be matched to 50Ω, whereby a power amplifier capable of increasing output power and operating high gain operation can be obtained.

In the second semiconductor device, the bonding pad may have an extended portion extending along a side surface of the die pad with an interval therebetween.

This allows the extended portion to function as an open-circuited stub (open stub).

In this case, the extended portion may be electrically connected to the die pad by a wire.

This allows the extended portion to function as a short-circuited stub (short stub).

The second semiconductor device may further include: a second inner lead placed parallel to the first inner lead and extending with an interval between the second inner lead and a side surface of the die pad, wherein the second inner lead may be electrically connected to the bonding pad by a wire.

This allows the second inner lead to function as an open-circuited stub (open stub).

In this case, the second inner lead may be electrically connected to the die pad by a wire.

This allows the second inner lead to function as a short-circuited stub (short stub).

The semiconductor device according to the present invention can implement a semiconductor device having a microwave and millimeter-wave power amplifier capable of increasing output power and performing high gain operation.

BRIEF DESCRIPTION OF THE DRAWINGS

FIG. 35A is a plan view, FIGS. 35B and 35C are cross-sectional views taken along lines XXXVb-XXXVb, XXXVc-XXXVc in FIG. 35A, respectively.

DETAILED DESCRIPTION (First Embodiment)

A semiconductor device according to a first embodiment of the present invention will be described with reference to FIGS. 1A-1B.

Figure 1A:
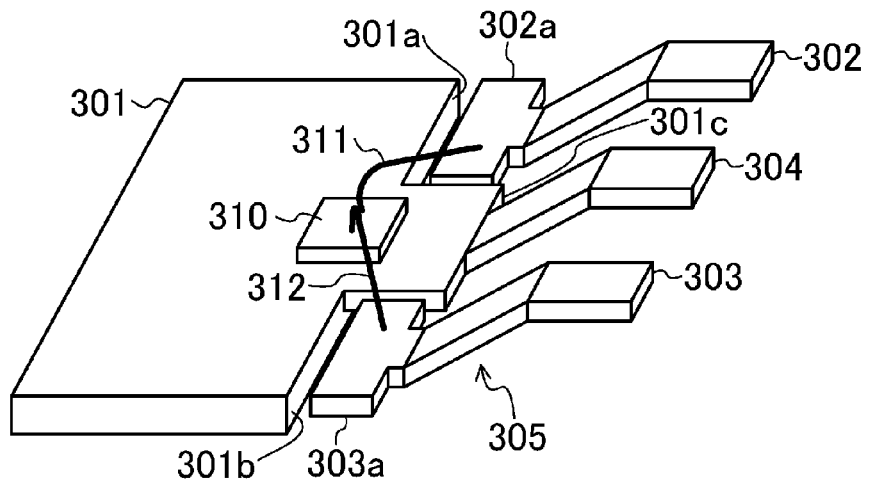
FIG. 1A is a perspective view showing a semiconductor device before resin sealing according to a first embodiment of the present invention.
Figure 1B:
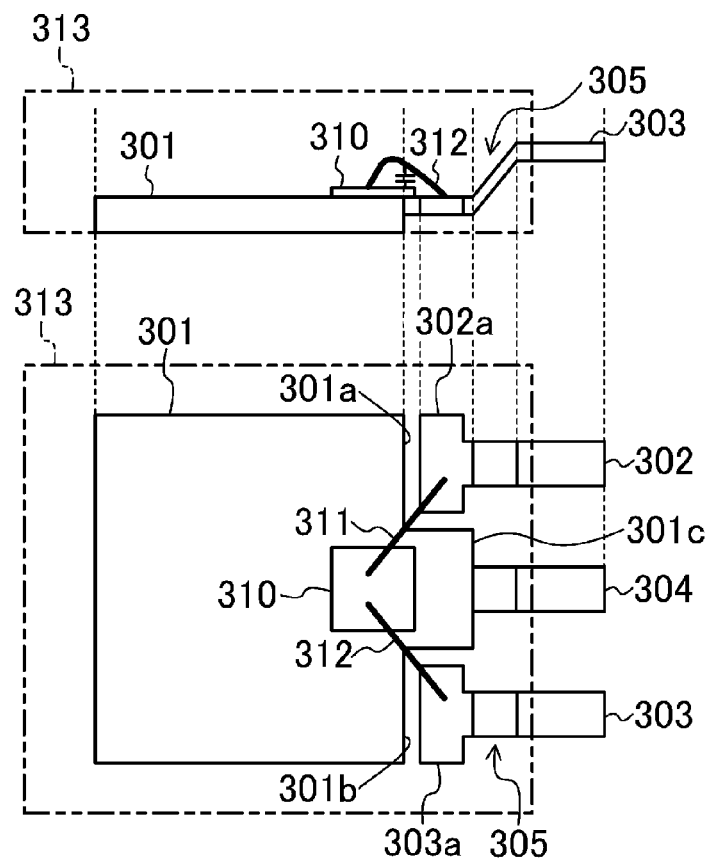
FIG. 1B shows a side view and a plan view of FIG. 1A.

As shown in FIG. 1A, the semiconductor device according to the first embodiment is in the form of, e.g., a resin-sealed package that holds on a lead frame a semiconductor chip 310 having a high frequency device. A resin sealing member is not shown in FIGS. 1A-1B and the embodiments that will be described later.

The lead frame according to the first embodiment is formed as an irregular-shaped frame having a thick plate portion with a thickness of about 1 mm to 2 mm and a thin plate portion with a thickness of about 0.4 mm to 0.5 mm, and being mainly composed of copper (Cu).

A die pad 301 that holds the semiconductor chip 310 on its upper surface by a die bonding material is formed in the thick plate portion, and a first inner lead 302, a second inner lead 303, and a suspension lead 304 are formed in the thin plate portion. A first bonding pad 302a and a second bonding pad 303a are provided at the ends on the die pad 301 side of the first inner lead 302 and the second inner lead 303, respectively.

A feature of the first embodiment is that the die pad 301 has cutout portions 301a, 301b where the bonding pads 302a, 303a are respectively placed at an interval of, e.g., about 0.4 mm to 0.5 mm from the cutout portions 301a, 301b. A protruding portion 301c is thus formed by the two cutout portions 301a, 301b in a region between the suspension lead 304 and the semiconductor chip 310 in the die pad 301.

Each cutout portion 301a, 301b is formed so as to be punched out in the die pad 301 in the direction from one of the front and rear principal surfaces of the die pad 301 to the other, and has a rectangular planar shape. The cutout portions 301a, 301b need not necessarily have the same planar shape, but may have different planar shapes from each other.

Each of the first inner lead 302, the second inner lead 303, and the suspension lead 304 has a bent portion 305 formed by press work using a die. The bent portion 305 need not necessarily be provided as it is formed according to the mount form on a board in a high frequency circuit section in a system or set incorporating the semiconductor device.

The first bonding pad 302a of the first inner lead 302 and the second bonding pad 303a of the second inner lead 303 are arranged such that their upper surfaces are located at substantially the same height as the upper surface of the die pad 301. The first bonding pad 302a and the second bonding pad 303a are formed so as to have a greater width than the first inner lead 302 and the second inner lead 303. Forming such wide bonding pads 302a, 303a can prevent the inner leads 302a, 303a from coming off from a sealing resin material after sealing a resin sealing region 313 shown in FIG. 1B with the sealing resin material.

Wire bonding pads formed on the upper surface of the semiconductor chip 310 described below are electrically connected to the bonding pads 302a, 303a of the first inner lead 302 and the second inner lead 303 by a first wire (metal thin wire) 311 and a second wire (metal thin wire) 312, respectively. The wires 311, 312 have substantially the same length.

The semiconductor chip 310 may be die-bonded at any desired position on the die pad 301 according to the case where it is desired to reduce the length of the wires 311, 312 or the case where it is desired for the plurality of wires to have the same length. In either case, however, the die bonding position is determined so that the center position of the semiconductor chip 310 is located on the protruding portion 301c side with respect to the center position of the die pad 301, and so that at least a part of the semiconductor chip 310 is located on the protruding portion 301c.

In the case of a small signal device, a silver paste material etc. can be used as a die bonding material that fixes the semiconductor chip 310 to the die pad 301. In the case of a power device, gold/tin (Au/Sn) eutectic solder etc. can be used as a solder material. Gold (Au) or aluminum (Al) is used for the wires 311, 312. Although only one wire 311 and only one wire 312 are provided in FIG. 1A, two or more wires 311 and two or more wires 312 may be provided in order to reduce inductance, to increase allowable current carrying capacity, etc.

The semiconductor chip 310 may use, e.g., a hetero-junction field effect transistor (HFET) that is formed in a gallium nitride (GaN)-based compound semiconductor grown on a substrate comprised of silicon (Si). A substrate having high specific resistance such as, e.g., a substrate having specific resistance of 1 kΩ·cm or more is used as the silicon substrate. The semiconductor chip 310 has a thickness of about 100 μm.

The semiconductor chip 310 is not limited to the gallium nitride (GaN)-based semiconductor, and a gallium arsenide (GaAs)-based metal semiconductor field effect transistor (MESFET), a pseudomorphic high electron mobility transistor (PHEMT), or a hetero-junction bipolar transistor (HBT) may be used, or a silicon (Si)-based metal oxide semiconductor field effect transistor (MOSFET) or a bipolar transistor may be used. An InP-based transistor etc. may also be used.

Figure 2A:
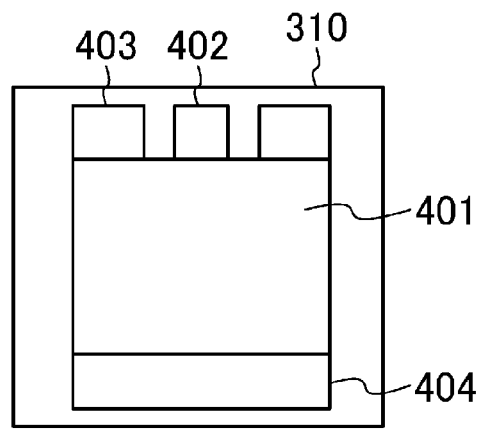
FIGS. 2A and 2B are views showing arrangement of an intrinsic region and wire bonding pads which form a transistor in a semiconductor chip according to the first embodiment of the present invention.
Figure 2B:
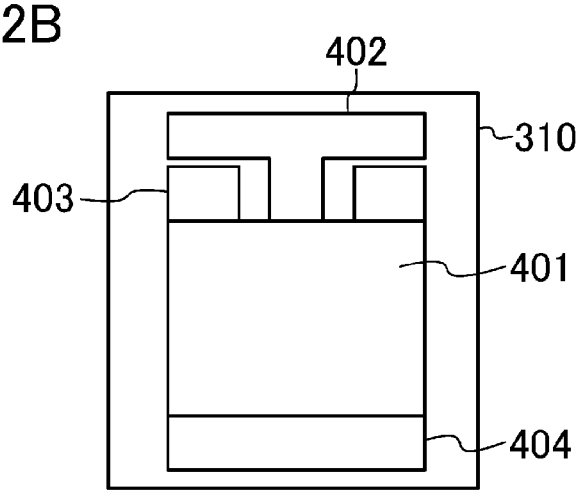

FIGS. 2A-2B show layouts of a transistor intrinsic region in semiconductor chip 310 and wiring (pad) in the semiconductor chip 310. In the present embodiment, the layouts shown in FIGS. 2A-2B are the layouts in the case where the first bonding pad 302a shown in FIGS. 1A-1B is placed as a gate bonding pad, and the second bonding pad 303a is placed as a drain bonding pad, with the source being grounded.

Figure 2C:
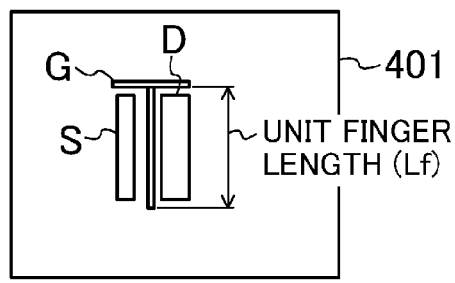
FIG. 2C is a schematic view showing the unit structure of a gate etc. in the intrinsic region.

As shown in FIG. 2C, in order to implement higher output power, the total gate width is typically increased by increasing the number of linear gates (fingers) in the FET and arranging the linear gates in a comb-like pattern or forming multiple cells by using every plurality of fingers as a unit.

As shown in FIGS. 2A-2B, an intrinsic region 401 of a GaN-based HFET is formed on the upper surface of the semiconductor chip 310. A gate electrode, a source electrode, and a drain electrode which are formed in the intrinsic region 401 are extended to the outside of the intrinsic region 401. Thus, a wire bonding gate pad 402, a wire bonding source pad 403, and a wire bonding drain pad 404 are formed around the intrinsic region 401.

The wire bonding gate pad 402 has different planar shapes between FIGS. 2A and 2B. The gate pad 402 shown in FIG. 2A has a substantially square planar shape, whereas the gate pad 402 shown in FIG. 2B has a T-shape as viewed in plan, which is formed by extending the gate pad 402 of FIG. 2A to both sides at right angles. The gate pad 402 of FIG. 2B is effective because a plurality of wires can be connected to the extended portions. The gate pad 402 shown in FIG. 2B functions as an open-circuited stub as a high frequency distributed constant element with respect to the gate pad 402 of FIG. 2A. Accordingly, the gate pad 402 of FIG. 2B is effective in matching transistor impedance to 50 Ω.

In the configuration of FIG. 2C, the unit finger length Lf is 400 μm, and the total gate width Wg is 4,800 μm because 12 fingers are used. The outer dimensions of semiconductor chip 310 are approximately 0.6 mm by 0.6 mm.

As described above, the die pad 301 including the semiconductor chip 310 and the bonding pads 302a, 303a are sealed with a sealing resin material such as epoxy in the resin sealing region 313. In this case, the surface (rear surface) of the die pad 301, which is located on the opposite side from the semiconductor chip 310, is exposed without being covered by the sealing resin material. This exposed portion of the die pad 301 plays an important role as a ground terminal or a heat dissipation path after a high frequency device or a power device is mounted on the die pad 301. The exposed portion is electrically connected to a ground pad on the board in the high frequency circuit section in the system or set by soldering etc.

The upper surface of the first bonding pad 302a and the upper surface of the second bonding pad 303a are located at substantially the same height as the upper surface of the die pad 301. This results in a short interval between the die pad 301 functioning as a ground potential surface and each of the wires 311, 312 that electrically connect the first bonding pad 302a and the second bonding pad 303a to the semiconductor chip 310 held on the die pad 30. This increases a ground capacitance component, namely a parallel capacitance component. This parallel capacitance component is shown as a parasitic capacitive element to the first wire 311 shown in FIG. 1B. Since this parallel capacitance component converts transistor impedance from low impedance to high impedance, high frequency loss from the semiconductor chip to outer leads is reduced. Moreover, since the parasitic capacitive element has a pre-matching function, impedance close to 50Ω can be implemented as the impedance at the lead ends of the package.

A region below the first bonding pad 302a of the inner lead 302 and a region below the second bonding pad 303a of the inner lead 303 are filled with the sealing resin material as a dielectric material. Accordingly, if the rear surface of the die pad 301 which is exposed from the sealing resin material is electrically connected to the ground pad on the board in the high frequency circuit section in the system or set by soldering etc., the sealing resin material filling the region below each inner lead 302, 303 serves as a ground capacitance component, i.e., a parallel capacitance component. Since this parallel capacitance component performs a pre-matching function, impedance close to 50Ω can be implemented as the impedance at the lead ends of the package.

As described above, according to the first embodiment, the wire length from each pad of the semiconductor chip 310 to the bonding pad 302a, 303a of the inner lead 302, 303 is reduced, and each wire has the same length. Moreover, the difference in level between each inner lead 302, 303 and the die pad 301 is eliminated. This can reduce the parasitic inductance component of the inner lead 302, 303 itself.

Moreover, since the ground capacitance component of the wire 311, 312 and the inner lead 302, 303 increases, high frequency loss from the semiconductor chip 310 to the outer leads can be reduced. As a result, a resin molded package of a high-performance high-output power amplifier can be implemented.

The first embodiment further has the following advantages. The configuration of the first embodiment can reduce the number of external chip capacitive elements, resistive elements, and inductors that are provided to achieve 50Ω matching in the case where the semiconductor device (package) is mounted on the board in the high frequency circuit section in the system or set. The configuration of the first embodiment can also deal with impedance matching in a broad frequency band.

(Manufacturing Method)

An example of a manufacturing method of the lead frame according to the first embodiment will be described below with reference to FIGS. 3A-3D.

Figure 3A:
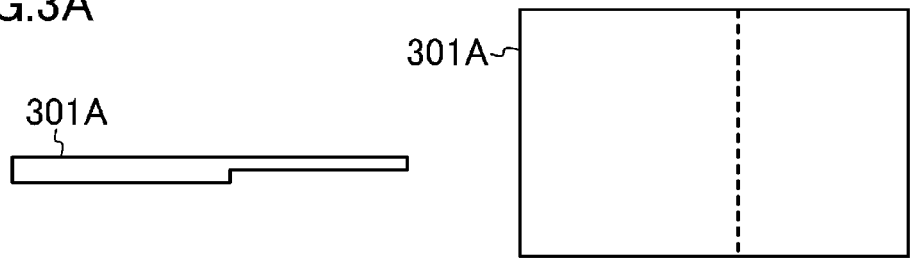
FIG. 3A-3D show side views and plan views sequentially illustrating an example of a method for manufacturing a lead frame of a semiconductor device according to the first embodiment of the present invention.
Figure 3B:
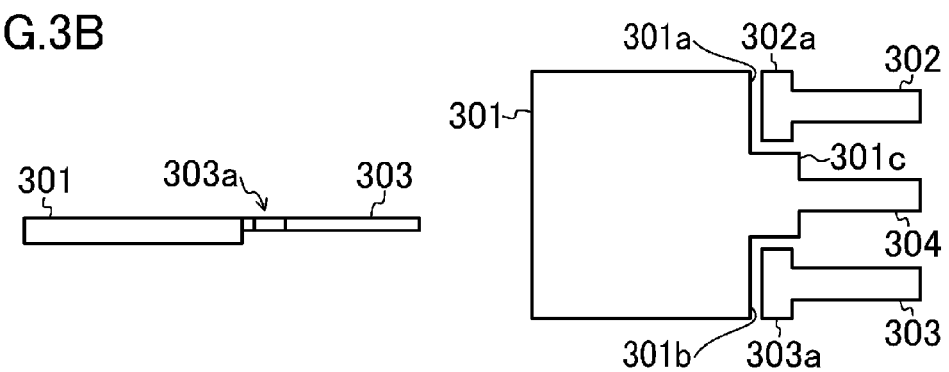

First, as shown in FIG. 3A, a die pad 301, a first inner lead 302, a second inner lead 303, a suspension lead 304, and a protruding portion 301c as shown in FIG. 3B are formed by punching of a metal plate 301A having a thick plate portion and a thin plate portion by using stamping. The leads 302 to 304 and the protruding portion 301c need not necessarily be formed by the stamping, but may be formed by etching if the thicknesses of the leads 302 to 304 and the protruding portion 301c are large enough to be able to be formed by etching.

Next, portions of the first inner lead 302, the second inner lead 303, and the die pad 301 are plated with silver as required. The silver plating is performed to facilitate alloying of each bonding pad with the wire when a semiconductor chip to be fixed to the die pad 30 is electrically connected to the first bonding pad 302a and the second bonding pad 303a by wires, and to increase the strength of thermocompression bonding in wire bonding. Moreover, a chamfered shape formed by chamfering or obliquely cutting off edges or corners, or a complex transverse sectional shape such as a recess can be formed in at least either each inner lead 302, 303 or in the die pad 301 by the stamping. This complex transverse sectional shape serves to strengthen mechanical engagement of each inner lead 302, 303 in a resin sealing member after resin sealing.

Figure 3C:
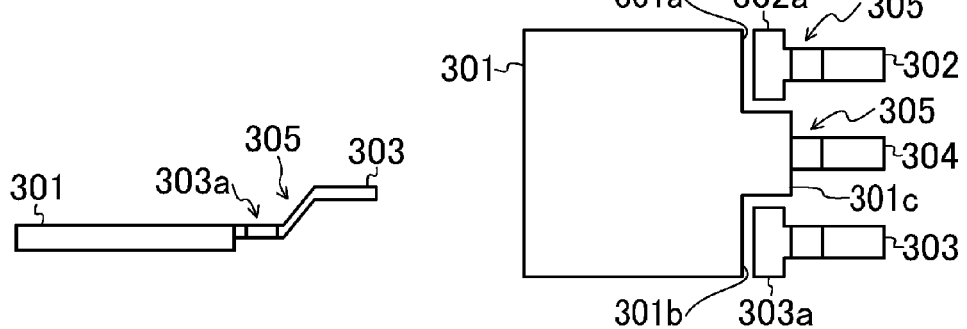

Then, as shown in FIG. 3C, a bent portion 305 is formed in a connection portion of each inner lead 302, 303 with a bonding pad 302a, 303a, and a connection portion of the suspension lead 304 with the protruding portion 301c of the die pad 301, by using press work.

Figure 3D:
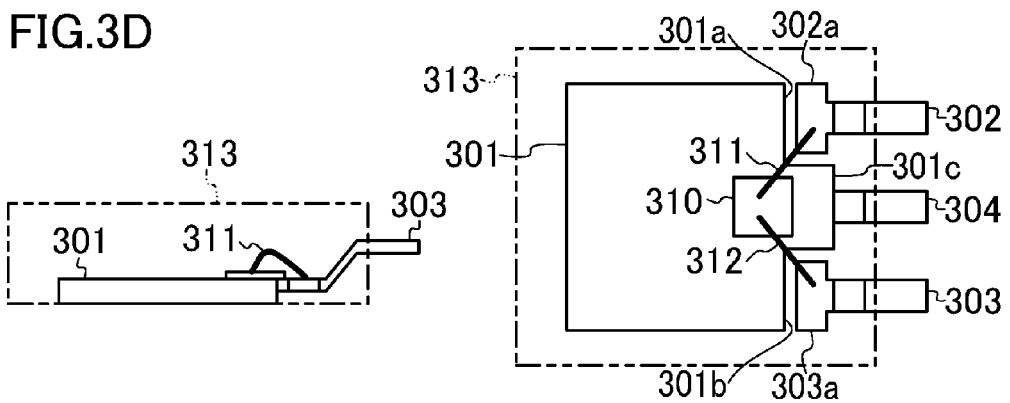

Subsequently, as shown in FIG. 3D, the semiconductor chip 310 is fixed to a predetermined position on the upper surface of the die pad 301. Specifically, the semiconductor chip 310 is fixed such that its center position is located on the protruding portion 301c side with respect to the center position of the die pad 301. Then, a wire bonding gate pad 402 and a wire bonding drain pad 404 on the semiconductor chip 310 shown in FIGS. 2A-2B are electrically connected to bonding pads 302a, 303a of the inner leads 302, 303 by a first wire 311 and a second wire 312, respectively. Thereafter, a resin sealing region 313 is sealed with a sealing resin material such as epoxy.

Outer leads exposed from the resin sealing region 313 in the first inner lead 302 and the second inner lead 303 are plated with tin (Sn) etc. These outer leads are cut off from the surrounding frame to obtain a desired semiconductor device.

Since this manufacturing method has the following three advantages, a resin molded package having a high-performance high-output power amplifier can be obtained.

Firstly, the cutout portions where the bonding pads of the inner leads are to be placed are formed in the die pad to reduce the difference in level between the die pad and the inner leads and the distance between the semiconductor chip and the bonding pads, whereby the length of each wire can be reduced. This can reduce parasitic inductance due to wires and can reduce high frequency loss from the semiconductor chip to the outer leads.

Secondly, since the ground capacitance component of the wires and the inner leads increases, the transistor impedance is converted from low impedance to high impedance. This reduces high frequency loss from the semiconductor chip to the outer leads. Moreover, since the ground capacitance component has a pre-matching function, impedance close to 50 Ω can be implemented as the impedance at the lead ends of the package. The above manufacturing method can thus reduce the number of external chip capacitive elements, resistive elements, and inductors that are mounted on a board to achieve 50Ω matching in the case where the package is mounted on the board in the high frequency circuit section in the system or set. The above manufacturing method can also deal with impedance matching in a broad frequency band.

Thirdly, the wires connecting the semiconductor chip to the bonding pads of the inner leads can be made to have the same length. Thus, a high frequency signal that is input to the semiconductor chip is in phase with a high frequency signal that is output from the semiconductor chip. This can prevent reduction in both output power and gain as a high-output power amplifier. If the wire length is different between the input side and the output side, high frequency signals that are transmitted through the wires may have different phases, and the phase of the high frequency signal that is input to the semiconductor chip may be shifted from that of the high frequency signal that is output from the semiconductor chip. This may reduce the output power and the gain as the high-output power amplifier and may degrade high frequency characteristics.

(First Modification of First Embodiment)

A semiconductor device according to a first modification of the first embodiment of the present invention will be described with reference to FIG. 4.

Figure 4:
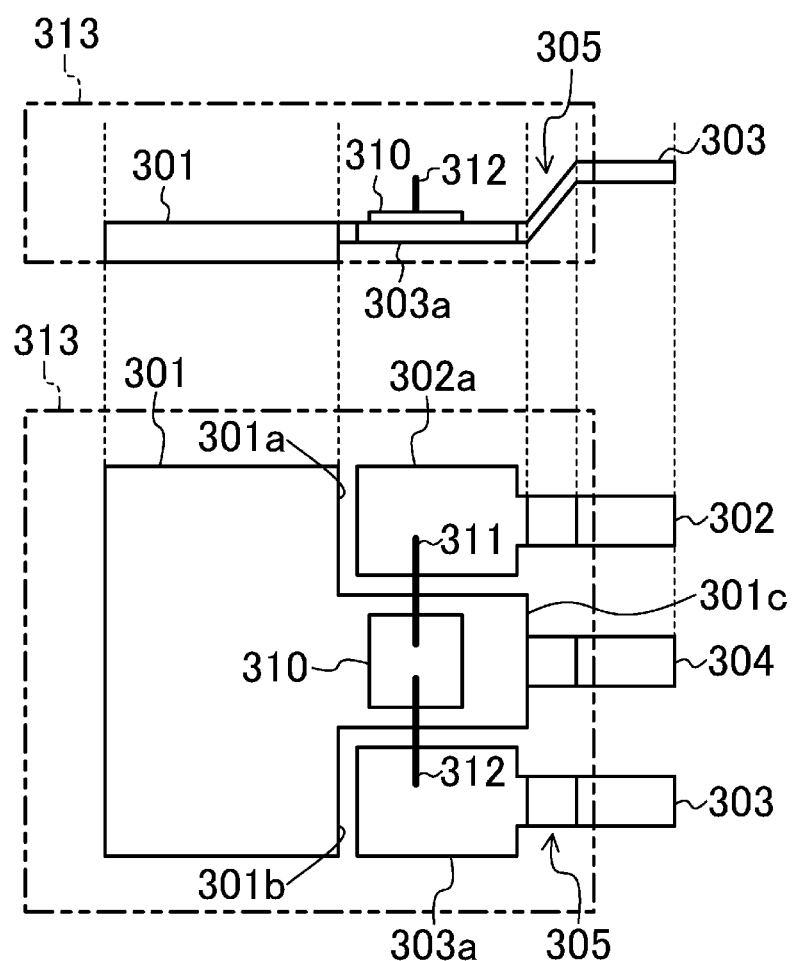
FIG. 4 shows a side view and a plan view showing a semiconductor device before resin sealing according to a first modification of the first embodiment of the present invention.

As shown in FIG. 4, in a lead frame according to the first modification, the cutout areas of the first and second cutout portions 301a, 301b formed in the die pad 301 are increased, and the plane areas of the bonding pads 302a, 303a of the inner leads 302, 303 are increased accordingly.

The semiconductor chip 310 is held on the protruding portion 301c interposed between the two cutout portions 301a, 301b.

The modification can thus further reduce the lengths of the wires 311, 312 that connect the semiconductor chip 310 to the first bonding pad 302a and the second bonding pad 303a.

(Second Modification of First Embodiment)

A semiconductor device according to a second modification of the first embodiment of the present invention will be described with reference to FIG. 5.

Figure 5:
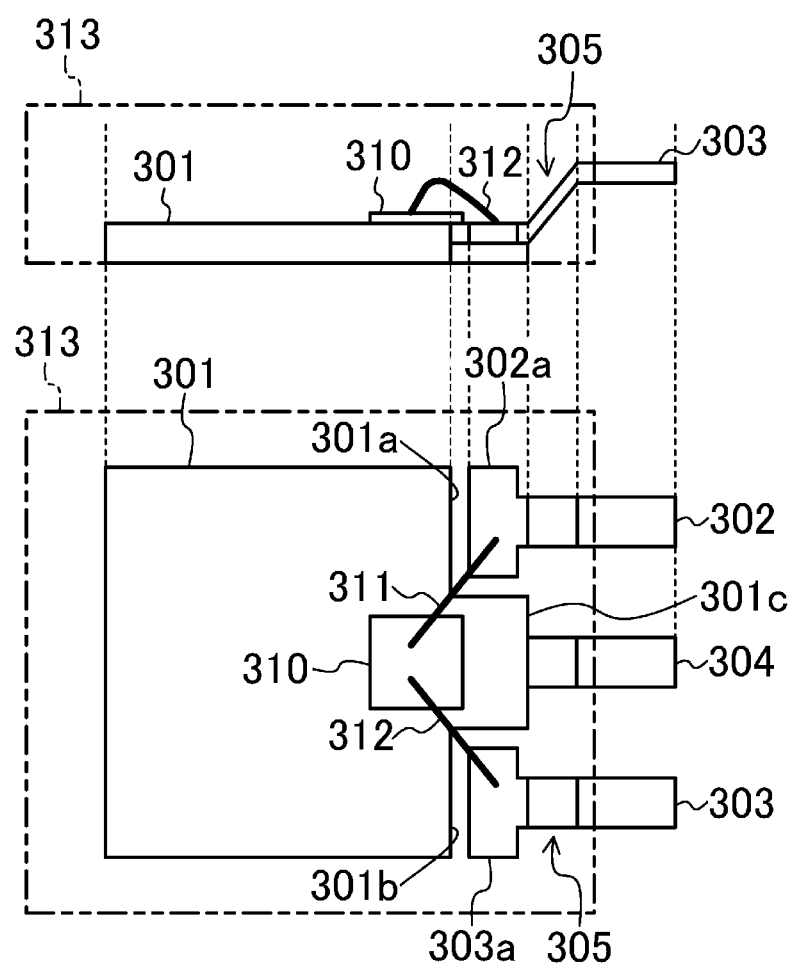
FIG. 5 shows a side view and a plan view showing a semiconductor device before resin sealing according to a second modification of the first embodiment of the present invention.

As shown in FIG. 5, in a lead frame according to the second modification, the protruding portion 301c of the die pad 301 may be formed by the thick plate portion like the die pad 301 instead of being formed by the thin plate portion.

(Third Modification of First Embodiment)

A semiconductor device according to a third modification of the first embodiment of the present invention will be described with reference to FIG. 6.

Figure 6:
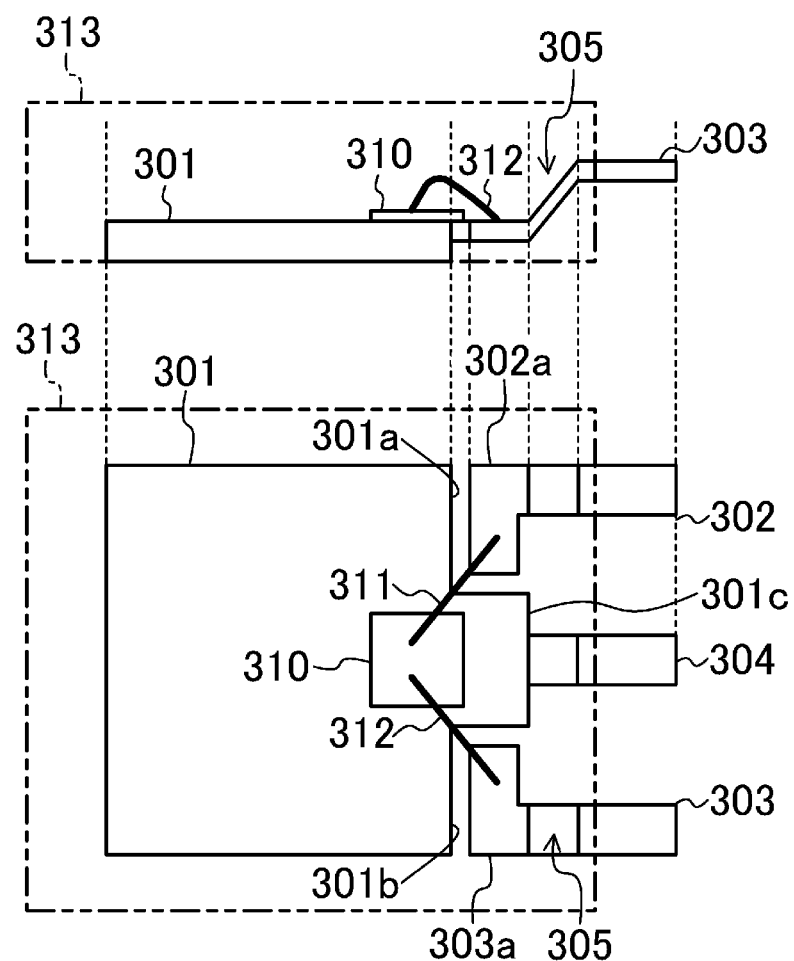
FIG. 6 shows a side view and a plan view showing a semiconductor device before resin sealing according to a third modification of the first embodiment of the present invention.

As shown in FIG. 6, a lead frame according to the third modification is formed so that the inner leads 302, 303 are aligned with the outer side surfaces of the bonding pads 302a, 303a, respectively.

The lead frame having this configuration can also provide advantages similar to those of the first embodiment.

(Fourth Modification of First Embodiment)

A semiconductor device according to a fourth modification of the first embodiment of the present invention will be described with reference to FIG. 7.

Figure 7:
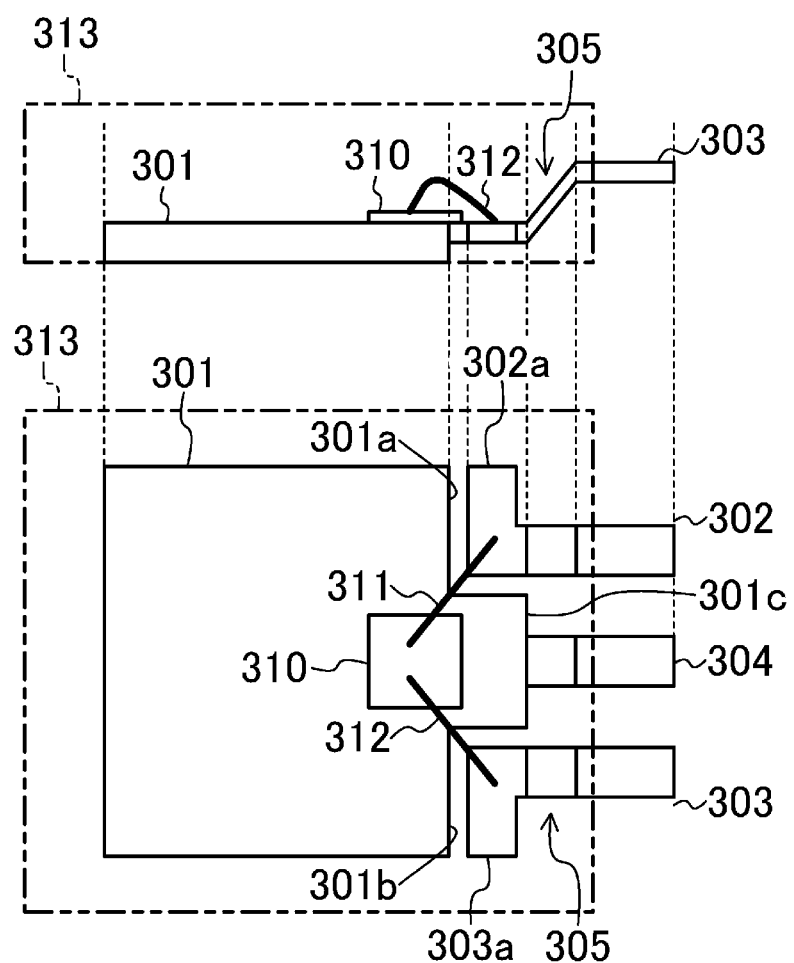
FIG. 7 shows a side view and a plan view showing a semiconductor device before resin sealing according to a fourth modification of the first embodiment of the present invention.

As shown in FIG. 7, a lead frame according to the fourth modification is formed so that the inner leads 302, 303 are aligned with the inner side surfaces of the bonding pads 302a, 303a, respectively.

The lead frame having this configuration can also provide advantages similar to those of the first embodiment.

(Fifth Modification of First Embodiment)

A semiconductor device according to a fifth modification of the first embodiment of the present invention will be described with reference to FIGS. 8A-8B.

Figure 8A:
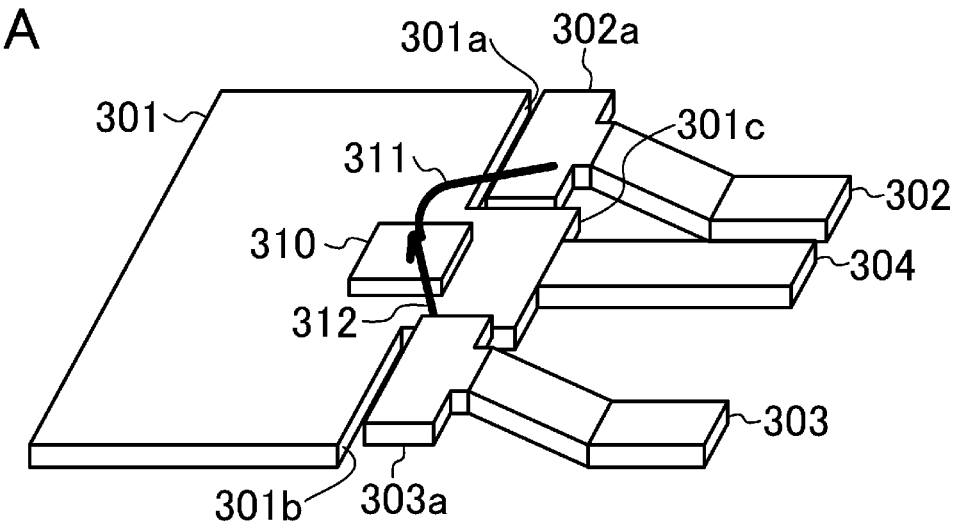
FIG. 8A is a perspective view showing a semiconductor device before resin sealing according to a fifth modification of the first embodiment of the present invention.
Figure 8B:
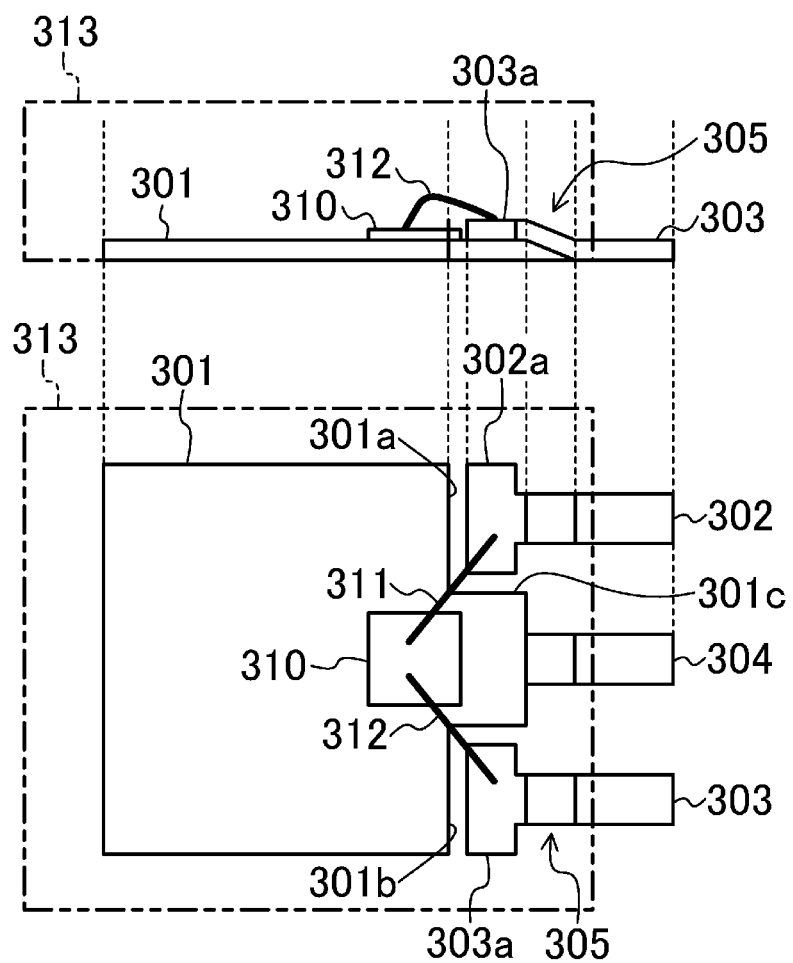
FIG. 8B shows a side view and a plan view of FIG. 8A.

As shown in FIGS. 8A-8B, according to the fifth modification, the entire lead frame is formed by a thin plate member primarily composed of copper (Cu) and having a uniform thickness of about 0.4 mm to 0.5 mm.

In the fifth modification, each of the first inner lead 302 and the second inner lead 303 has a bent portion 305 bent upward by press work using a die. Specifically, the bending work is performed so that the lower surfaces of the bonding pads 302a, 303a are located at substantially the same height as the upper surface of the die pad 301.

Since whether the bent portion 305 is required or not depends on the mount form on a board in a high frequency circuit section in a system or set, the bent portion 305 may not be provided.

The third modification or the fourth modification may be applied to the planar shape of each inner lead 302, 303.

In the case where the bent portion 305 is provided in the first inner lead 302 and the second inner lead 303, a region below the first bonding pad 302a and a region below the second bonding pad 303a are filled with a sealing resin material as a dielectric material. Accordingly, if the rear surface of the die pad 301 which is exposed from the sealing resin material is electrically connected to the ground pad on the board in the high frequency circuit section in the system or set by soldering etc., the sealing resin material filling the region below each bonding pad 302a, 303b serves as a ground capacitance component, i.e., a parallel capacitance component. Since this parallel capacitance component performs a pre-matching function, transistor impedance is converted from low impedance to high impedance. This reduces high frequency loss from the semiconductor chip to the outer leads. Moreover, since the capacitance component performs the pre-matching function, impedance close to 50Ω can be implemented as the impedance at the lead ends of the package.

Furthermore, the configuration of the fifth modification can reduce the number of external chip capacitive elements, resistive elements, and inductors that are provided to achieve 50Ω matching in the case where the semiconductor device of the fifth modification is mounted on the board in the high frequency circuit section in the system or set. The configuration of the fifth modification can also deal with impedance matching in a broad frequency band.

(Sixth Modification of First Embodiment)

A semiconductor device according to a sixth modification of the first embodiment of the present invention will be described with reference to FIGS. 9A-9B.

Figure 9A:
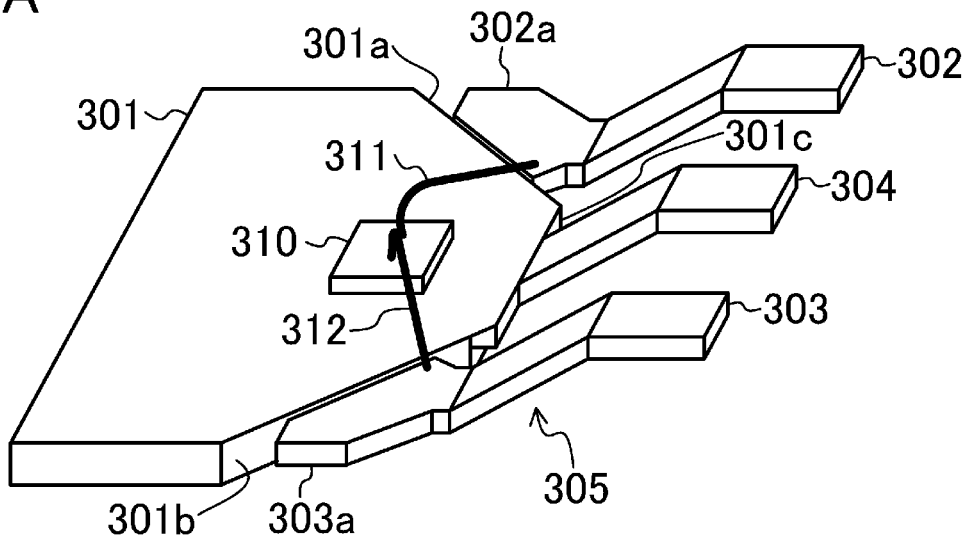
FIG. 9A is a perspective view showing a semiconductor device before resin sealing according to a sixth modification of the first embodiment of the present invention.
Figure 9B:
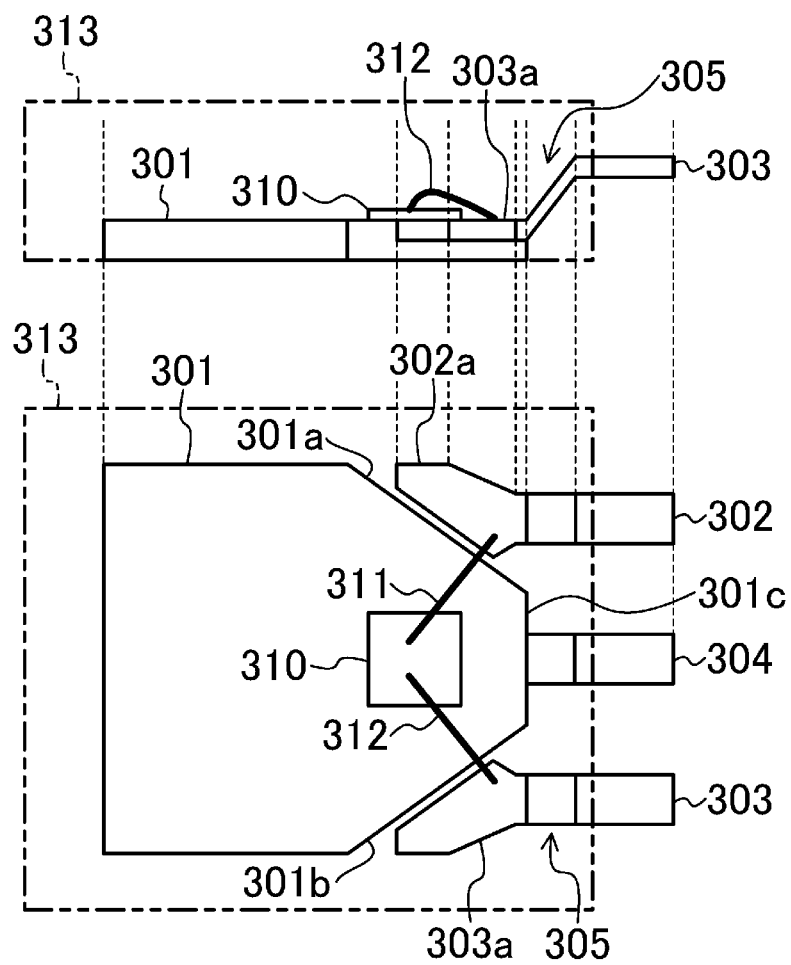
FIG. 9B shows a side view and a plan view of FIG. 9A.

As shown in FIGS. 9A-9B, in a lead frame according to the sixth modification, the cutout portions 301a, 301b that are formed in the die pad 301 have a triangular planar shape. Each of the bonding pads 302a, 303a provided for the inner leads 302, 303 thus has a planar shape conforming to the side surface as an oblique side of a corresponding one of the cutout portions 301a, 301b.

(Seventh Modification of First Embodiment)

A semiconductor device according to a seventh modification of the first embodiment of the present invention will be described with reference to FIGS. 10A-10B.

Figure 10A:
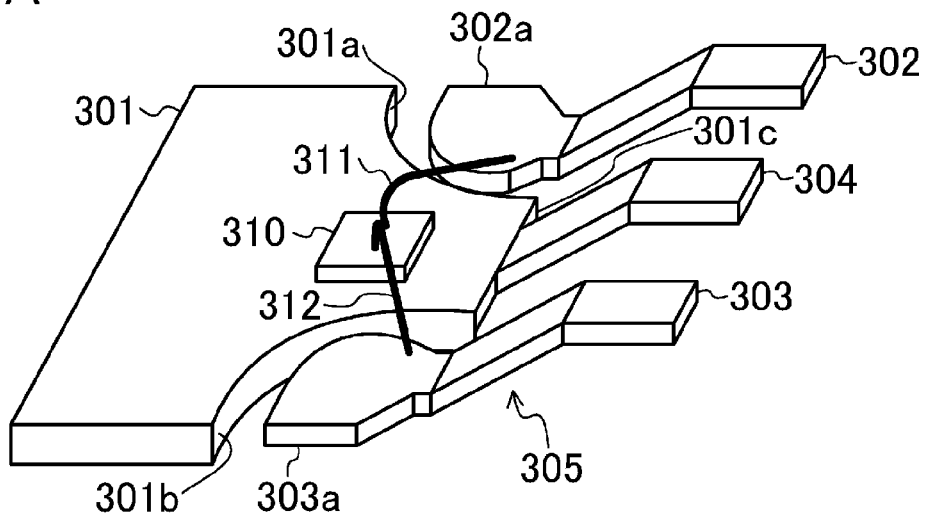
FIG. 10A is a perspective view showing a semiconductor device before resin sealing according to a seventh modification of the first embodiment of the present invention.
Figure 10B:
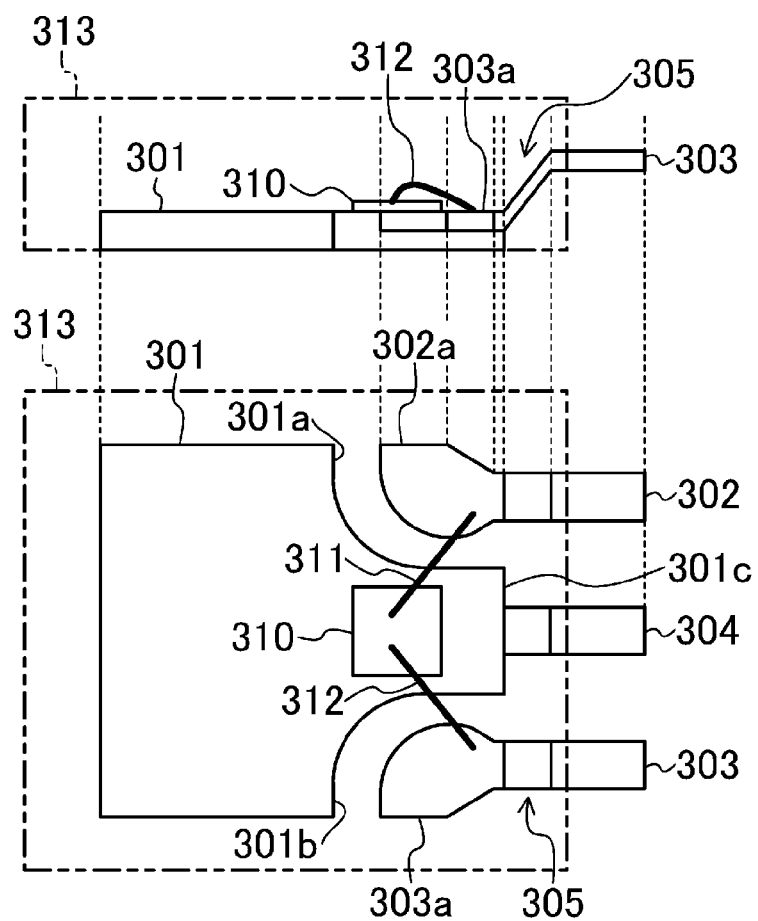
FIG. 10B shows a side view and a plan view of FIG. 10A.

As shown in FIGS. 10A-10B, in a lead frame according to the seventh modification, the cutout portions 301a, 301b that are formed in the die pad 301 have a concave circular-arc planar shape. Each of the bonding pads 302a, 303a provided for the inner leads 302, 303 thus has a convex circular-arc shape conforming to the concave circular-arc shaped side surface of a corresponding one of the cutout portions 301a, 301b.

The cutout portions 301a, 301b may have a convex circular-arc planar shape instead of the concave circular-arc planar shape. In this case as well, each of the bonding pads 302a, 303a is formed to have a planar shape conforming to the circular-arc shaped side surface of a corresponding one of the cutout portions 301a, 301b.

(Eighth Modification of First Embodiment)

A semiconductor device according to an eighth modification of the first embodiment of the present invention will be described with reference to FIG. 11.

Figure 11:
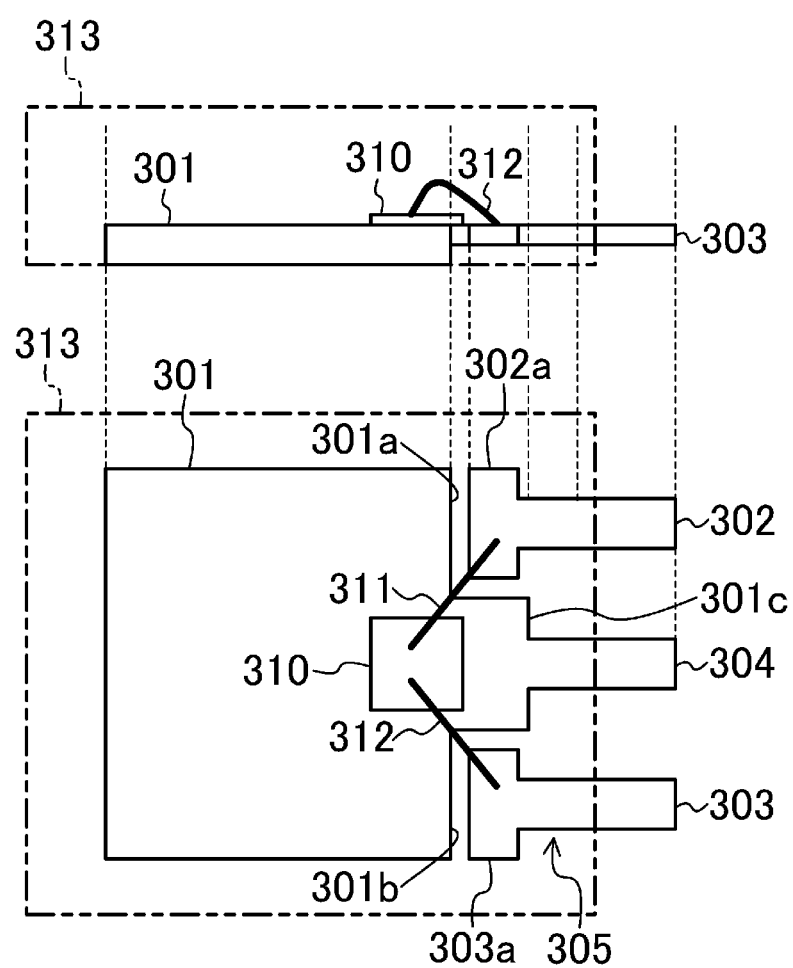
FIG. 11 shows a side view and a plan view showing a semiconductor device before resin sealing according to an eighth modification of the first embodiment of the present invention.

As shown in FIG. 11, a lead frame according to the eighth modification is configured so that none of the first inner lead 302, the second inner lead 303, and the suspension lead 304 has the bent portion 305. Thus, the upper surfaces of the inner leads 302, 303 and the suspension lead 304 are located at substantially the same height as the upper surface of the die pad 301 (protruding portion 301c).

However, the inner leads 302, 303 and the suspension lead 304 are formed in the thin plate portion.

The lead frames according to the sixth to eighth modifications as described above can also provide advantages similar to those of the first embodiment.

(Second Embodiment)

Figure 12A:
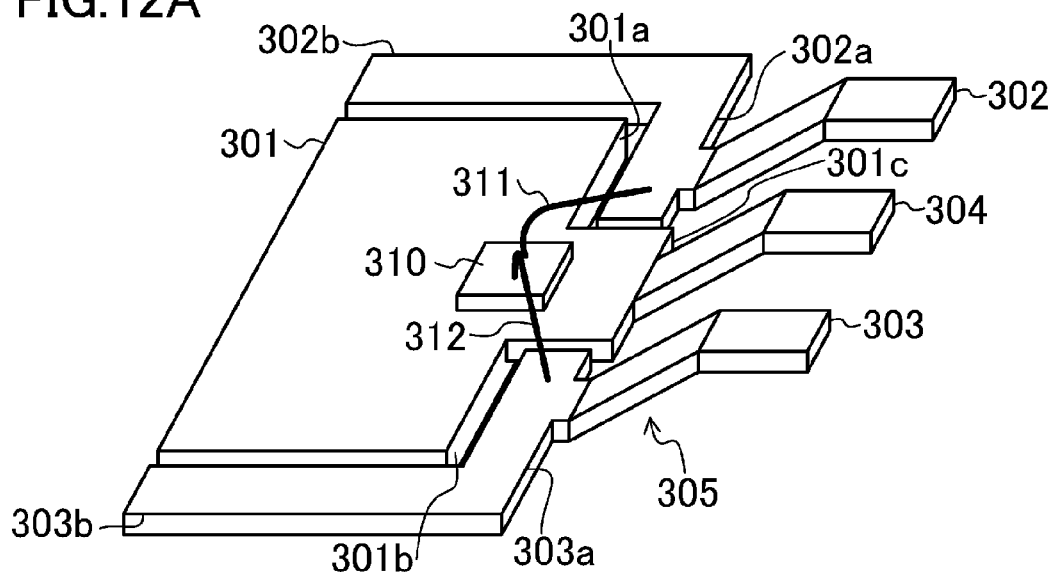
FIG. 12A is a perspective view showing a semiconductor device before resin sealing according to a second embodiment of the present invention.
Figure 12B:
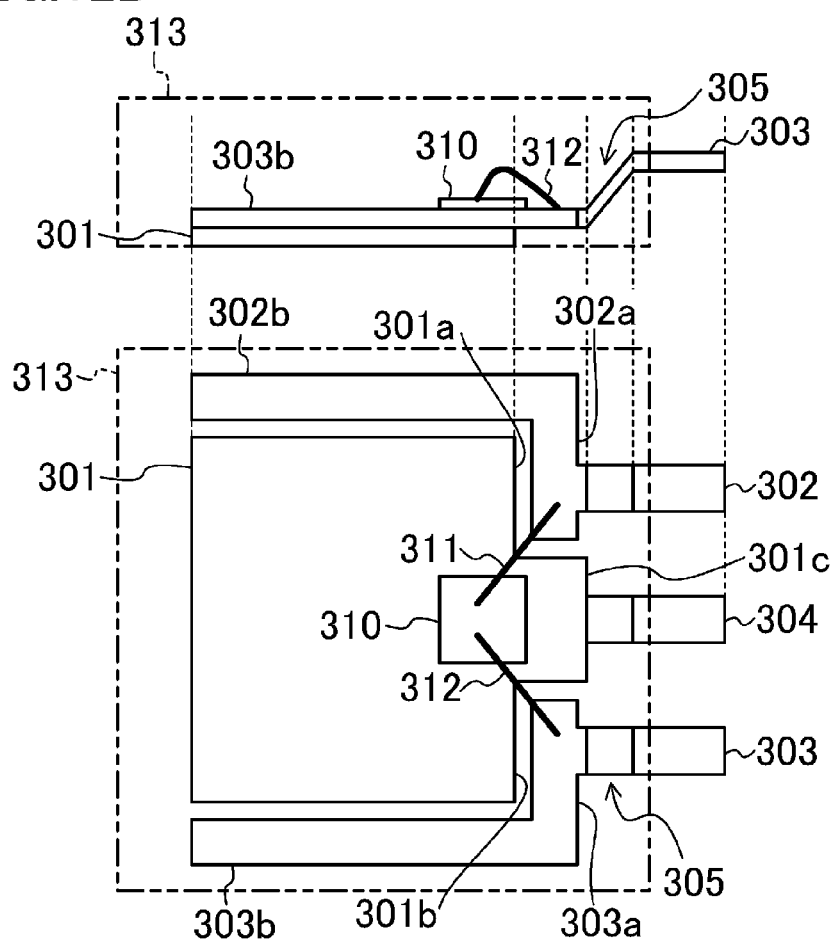
FIG. 12B shows a side view and a plan view of FIG. 12A.

A semiconductor device according to a second embodiment of the present invention will be described with reference to FIGS. 12A-12B. In FIGS. 12A-12B, the same constituent members as those shown in FIGS. 1A-1B are denoted with the same reference characters, and only those constituent members different from those of the first embodiment will be described below.

As shown in FIGS. 12A-12B, a first inner lead 302 and a second inner lead 303 of a lead frame according to the second embodiment are provided with a first extended portion 302b and a second extended portion 303b, respectively. The first extended portion 302b and the second extended portion 303b are respectively formed by extending the outer ends of bonding pads 302a, 303a along the opposing side surfaces (side surfaces parallel to the longitudinal direction of the inner leads) of a die pad 301 with an interval therebetween.

The interval between the die pad 301 side of each extended portion 302b, 303b and the side surface of the die pad 301 is about 0.4 mm to 0.5 mm.

The extended portions 302b, 303b function as an open-circuited stub (open stub) of a high frequency distributed constant element, and are effective in matching transistor impedance to 50 Ω.

As described in the first embodiment, if the parallel capacitance to the ground plane increases, this parallel capacitance contributes to 50Ω matching due to the pre-matching function.

Frequency dependence of the parallel capacitance component is approximately equal to that of the open-circuited stub (open stub) of the distributed contact element. However, the length of the open stub is equal to or less than a quarter of the wavelength as the electrical length of a desired frequency. Accordingly, since the length of the open stub varies according to the frequency of a high frequency signal that is transmitted in the semiconductor device, optimal lengths of the first extended portion 302b and the second extended portion 303b vary according to the frequency.

Accordingly, the position of the tip end of each extended portion 302b, 303b (the end located on the opposite side from the protruding portion 301c) is actually in the range from the side surface of the die pad 301 which is located on the opposite side from the protruding portion 301c to the connection position with each bonding pad 302a, 303a, and the length of each extended portion 302b, 303b is adjusted to an appropriate value. The first extended portion 302b and the second extended portion 303b may have different lengths form each other.

A region below each bonding pad 302a, 303a and a region below each extended portion 302b, 303b are filled with a sealing resin material as a dielectric material. Thus, if the rear surface of the die pad 301 which is exposed from the sealing resin material is electrically connected to a ground pad on a board in a high frequency circuit section in a system or set by soldering etc., the sealing resin material filling the region below each extended portion 302b, 303b serves as a ground capacitance component, i.e., a parallel capacitance component. Since the parallel capacitance component performs a pre-matching function, impedance close to 50Ω can be implemented as the impedance at the lead ends of the package. The configuration of the second embodiment can thus reduce the number of external chip capacitive elements, resistive elements, and inductors that are provided to achieve 50Ω matching in the case where the semiconductor device (package) is mounted on the board in the high frequency circuit section in the system or set. The configuration of the second embodiment can also deal with impedance matching in a broad frequency band.

Figure 13A:
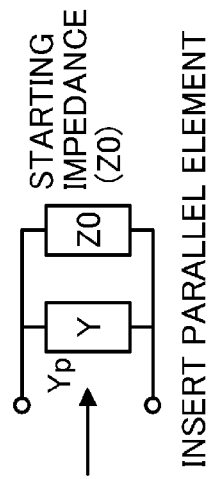
FIG. 13A is a diagram illustrating an impedance locus on a Smith chart.
Figure 13A:
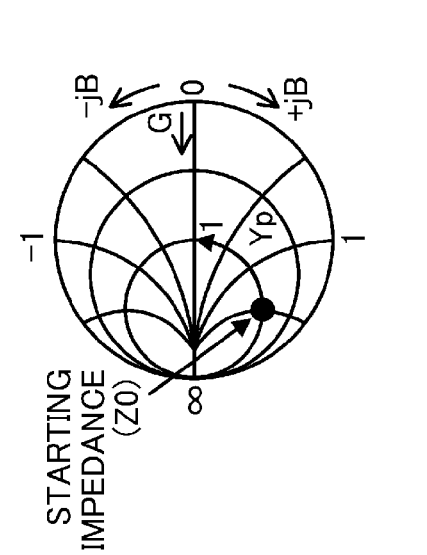
Figure 13B:
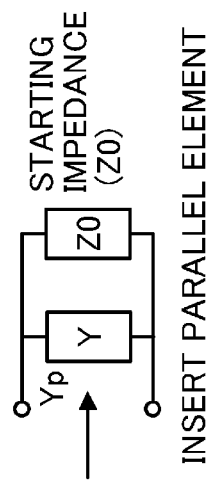
FIGS. 13B-13C are diagrams illustrating an impedance locus on an admittance chart.
Figure 13B:
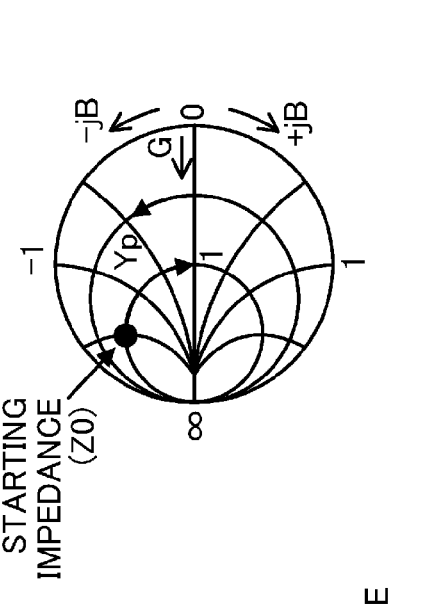
Figure 13C:
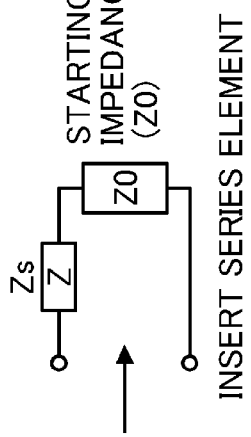
Figure 13C:
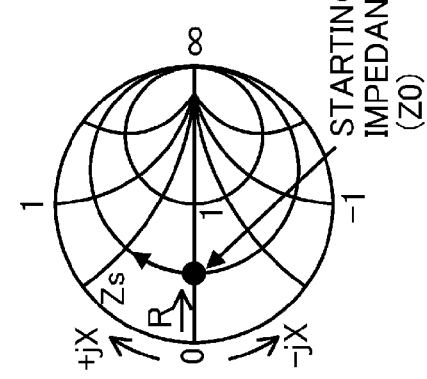

FIGS. 13A-13C illustrate that the frequency dependence of the parallel capacitance component is approximately equal to that of the open-circuited stub of the distributed contact element.

FIG. 13A shows an impedance locus on a Smith chart as viewed in the direction of an arrow in the case where an inductance component L is inserted as a series element (Zs) with a starting impedance (Z0). FIG. 13B shows an impedance locus on an admittance chart as viewed in the direction of an arrow in the case where a capacitance component is inserted as a parallel element (Yp) to a starting impedance (Z0). FIG. 13C shows an impedance locus on an admittance chart as viewed in the direction of an arrow in the case where an inductance component is inserted as a parallel element (Yp) to a starting impedance (Z0).

The Smith chart shows the relation between impedance and reflection coefficient, and the admittance chart shows the relation between admittance and reflection coefficient. The Smith chart is suitable for handling series circuits (elements), and the admittance chart is suitable for handling parallel circuits (elements). Each chart shows the impedance or admittance normalized by characteristic impedance as a reference. Characteristic impedance of 50Ω is typically used as a reference.

As described above, the rear surface of the die pad 301 is exposed without being covered by the sealing resin material. This exposed portion plays an important role as a ground terminal and a heat dissipation path when a high frequency device or a power device is mounted on a mount substrate.

That is, the rear surface of the die pad 301 is electrically connected to the ground pad on the board in the high frequency circuit section in the system or set by soldering etc. The upper surface of the first bonding pad 302 and the upper surface of the second bonding pad 303 are located at substantially the same height as the upper surface of the die pad 301. This reduces the interval between each of a first wire 311 and a second wire 312 that electrically connect a semiconductor chip 310 fixed to the die pad 301 to the first bonding pad 302 and the second bonding pad 303 and the die pad 301 functioning as a ground potential surface, and thus increases a ground capacitance component, i.e., a parallel capacitance component.

Since this parallel capacitance component converts the transistor impedance from low impedance to high impedance, high frequency loss from the semiconductor chip to outer leads is reduced. Moreover, the parallel capacitance component has a pre-matching function, impedance close to 50Ω can be implemented as the impedance at the lead ends of the package.

A method for manufacturing a lead frame according to the second embodiment is the same as that according to the first embodiment shown in FIGS. 3A-3D except the step of punching out the extended portions 302b, 303b, which are extended from the bonding pads 302a, 303a of the inner leads 302, 303, from the thin plate portion integrally with the bonding pads 302a, 303a.

Since the above configuration of the second embodiment provides a fourth advantage described below in addition to the three advantages described in the first embodiment, a resin molded package having a high-performance high-output power amplifier can be obtained.

The fourth advantage is as follows. The first extended portion 302b of the first bonding pad 302a and the second extended portion 303b of the second bonding pad 303a function as an open-circuited stub (open stub) as a high frequency distributed constant element, which equivalently increases parallel capacitance. Since the transistor impedance is converted from low impedance to high impedance by the pre-matching function of this increased parallel capacitance, high frequency loss from the semiconductor chip to the outer leads is reduced, and impedance close to 50Ω can be implemented as the impedance at the lead ends of the package.

(First Modification of Second Embodiment)

A semiconductor device according to a first modification of the second embodiment of the present invention will be described below with reference to FIG. 14.

Figure 14:
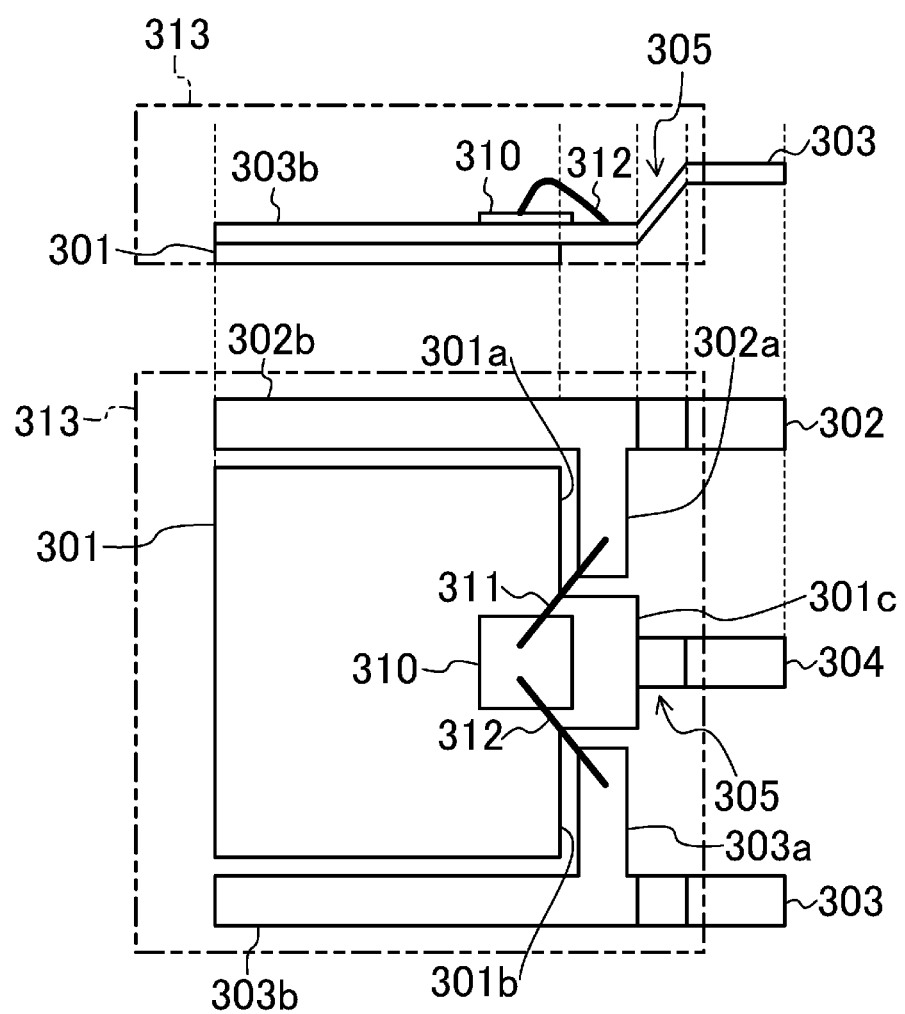
FIG. 14 shows a side view and a plan view showing a semiconductor device before resin sealing according to a first modification of the second embodiment of the present invention.

As shown in FIG. 14, a lead frame according to the first modification is formed so that the inner leads 302, 303 are aligned with the outer side surfaces of the bonding pads 302a, 303a, respectively, and so that the centerlines in the longitudinal direction of the inner leads 302, 303 are aligned with those in the longitudinal direction of the extended portions 302b, 303b, respectively.

The lead frame having this configuration can also provide advantages similar to those of the second embodiment.

(Second Modification of Second Embodiment)

A semiconductor device according to a second modification of the second embodiment of the present invention will be described below with reference to FIG. 15.

Figure 15:
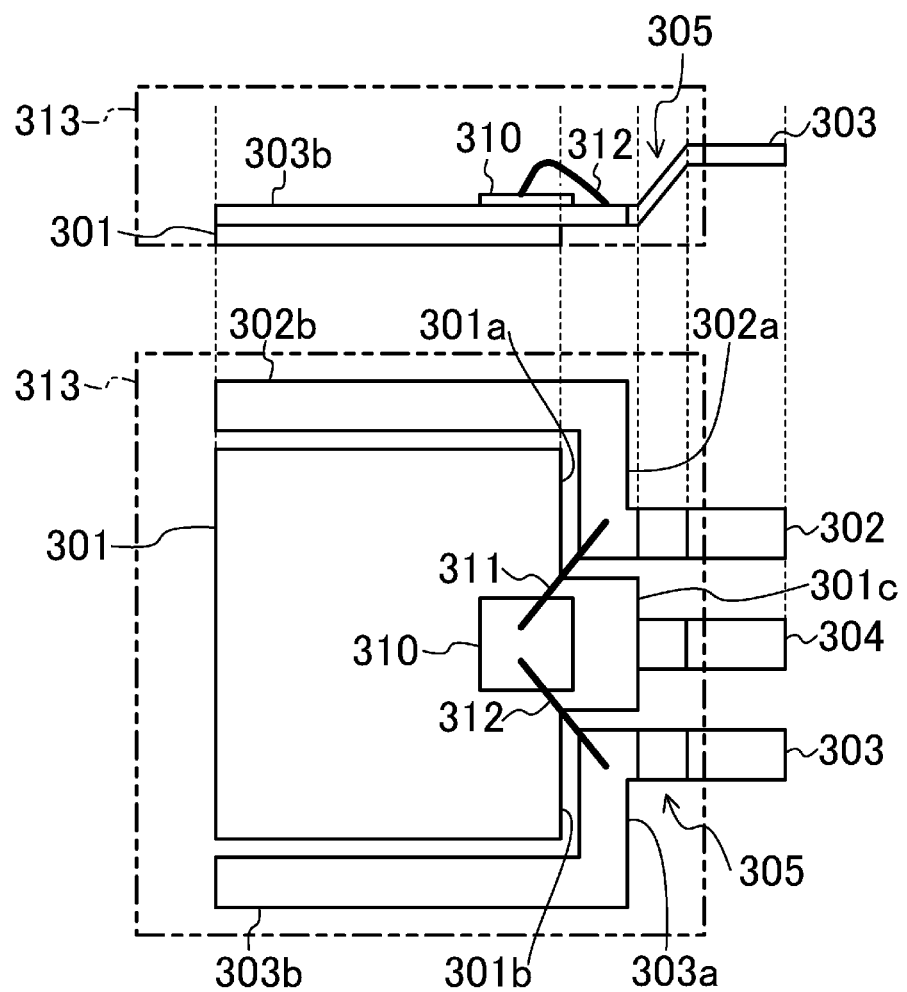
FIG. 15 shows a side view and a plan view showing a semiconductor device before resin sealing according to a second modification of the second embodiment of the present invention.

As shown in FIG. 15, a lead frame according to the second modification is formed so that the inner leads 302, 303 are aligned with the inner side surfaces of the bonding pads 302a, 303a, respectively.

The lead frame having this configuration can also provide advantages similar to those of the second embodiment.

The inner lead may be connected to the bonding pad at any position between the outer portion and the inner portion of the bonding pad.

(Third Modification of Second Embodiment)

A semiconductor device according to a third modification of the second embodiment of the present invention will be described below with reference to FIGS. 16A-16B.

Figure 16A:
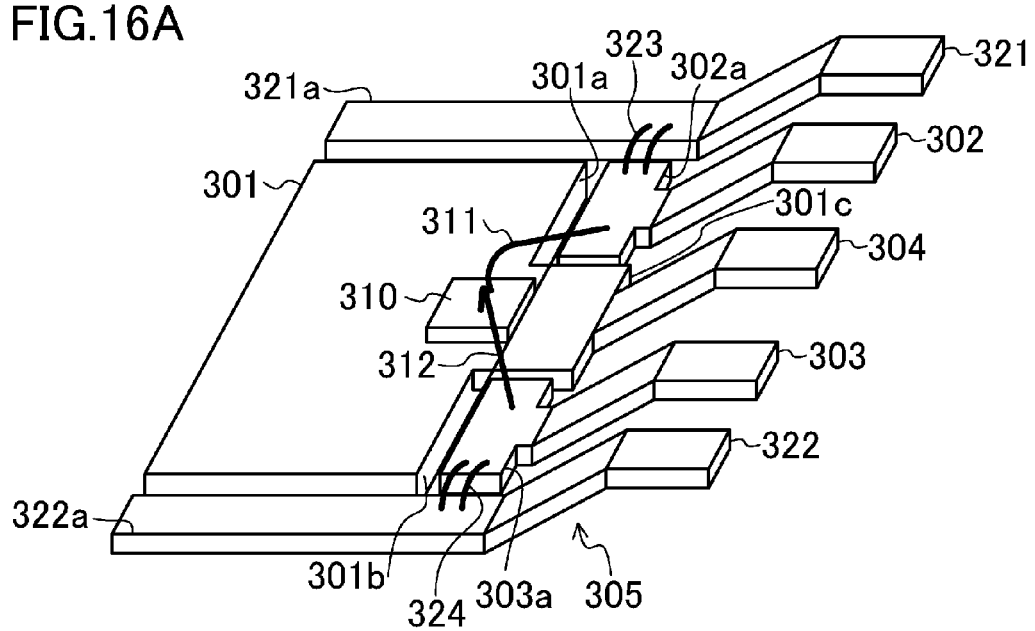
FIG. 16A is a perspective view showing a semiconductor device before resin sealing according to a third modification of the second embodiment of the present invention.
Figure 16B:
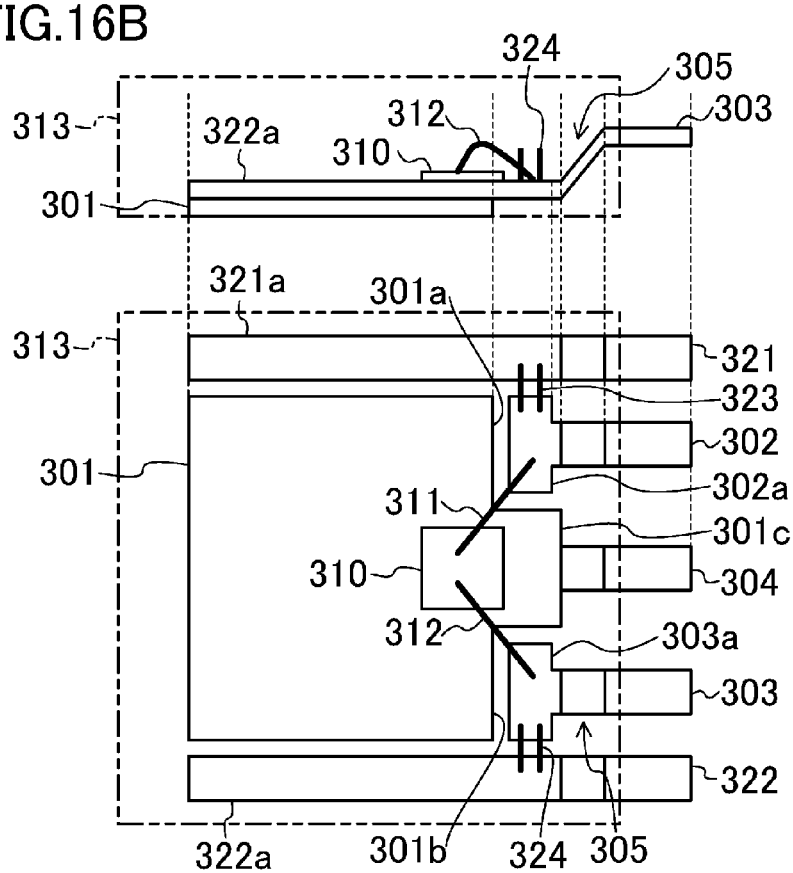
FIG. 16B shows a side view and a plan view of FIG. 16A.

As shown in FIGS. 16A-16B, a lead frame according to the second embodiment is formed so that an open-circuited stub (open stub) is not formed integrally with the bonding pads 302a, 303a, but is formed as a third inner lead 321 and a fourth inner lead 322 which are separate from the bonding pads 302a, 303a.

Specifically, the third inner lead 321 has a first extended portion 321a located outside the first inner lead 302 and extending parallel to the side surface of the die pad 301. The fourth inner lead 322 has a second extended portion 322a located outside the second inner lead 303 and extending parallel to the side surface of the die pad 301.

In order for the first extended portion 321a of the third inner lead 321 to function as an open-circuited stub of a high frequency distributed constant element, the third inner lead 321 is electrically connected to the first bonding pad 302a by a third wire 323. Similarly, the fourth inner lead 322 is electrically connected to the second bonding pad 303a by a fourth wire 324.

When this package is mounted on a board in a high frequency circuit section in a system or set, the outer lead sides of the third inner lead 321 and the fourth inner lead 322 may be non-connection (NC). If a chip capacitive element etc. is electrically connected, the chip capacitive element functions as the pre-matching function described above.

As in the fifth modification of the first embodiment, the lead frame may be comprised of a thin plate material having a uniform thickness of 0.4 mm to 0.5 mm, the die pad 301, the first inner lead 302, the second inner lead 303, and the suspension lead 304 may be formed from the thin plate material, and the extended portions 302b, 303b may be formed from the outer portions of the first bonding pad 302a and the second bonding pad 303a, respectively.

In this case, as in the fifth modification of the first embodiment, the bonding pads 302a, 303a and the extended portions 302b, 303b are bent so as to be located at substantially the same height as the upper surface of the die pad 301.

In the second embodiment and its modifications, the planar shapes of FIGS. 9A-9B and 10A-10B are applicable to the cutout portions 301a, 301b formed in the die pad 301.

(Third Embodiment)

Figure 17A:
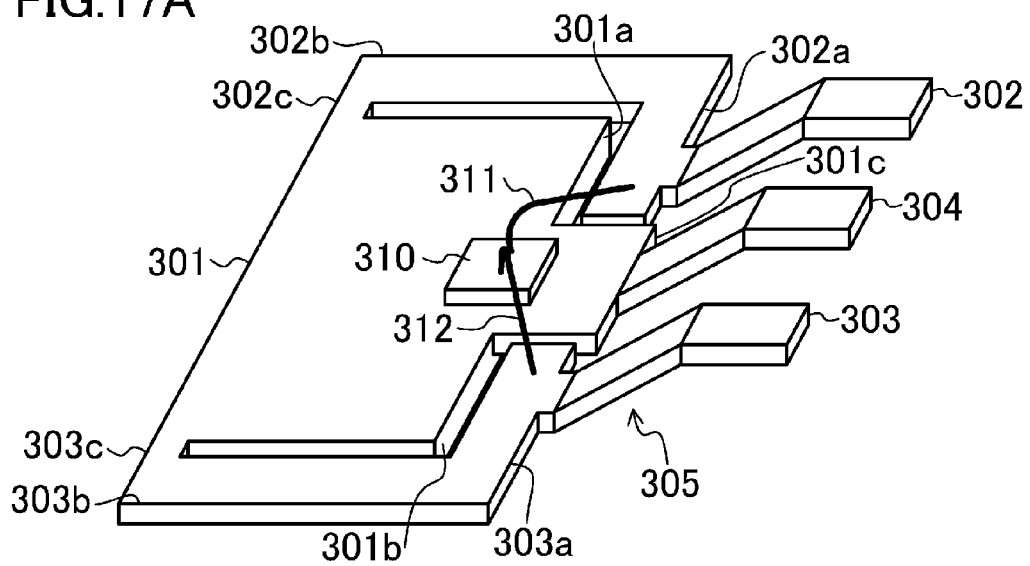
FIG. 17A is a perspective view showing a semiconductor device before resin sealing according to a third embodiment of the present invention.
Figure 17B:
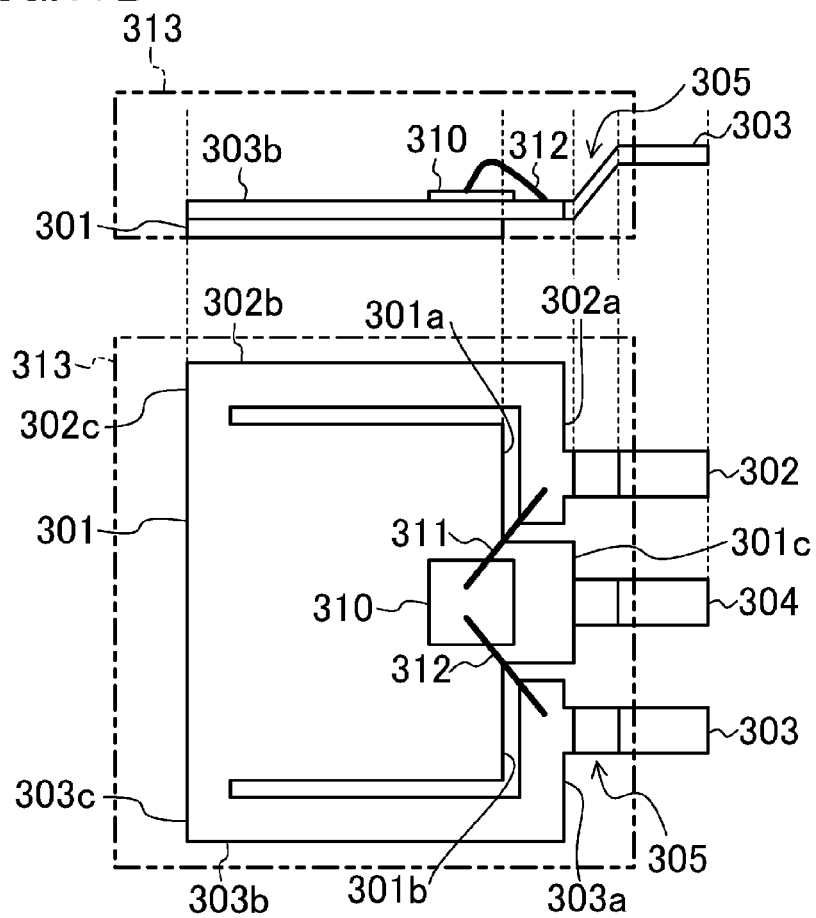
FIG. 17B shows a side view and a plan view of FIG. 17A.

A semiconductor device according to a third embodiment of the present invention will be described with reference to FIGS. 17A-17B. In FIGS. 17A-17B, the same constituent members as those shown in FIGS. 12A-12B are denoted with the same reference characters, and only those constituent members different from those shown in FIGS. 12A-12B will be described below.

As shown in FIGS. 17A-17B, in a lead frame according to the third embodiment, the end of a first extended portion 302b of a first bonding pad 302a and the end of a second extended portion 303b of a second bonding pad 303a are electrically connected to a die pad 301 by a first protruding connection portion 302c and a second protruding connection portion 303c, respectively.

As a package, if the die pad 301 exposed from a sealing resin material is electrically connected to a ground pad on a board in a high frequency circuit section in a system or set by soldering etc., both the first extended portion 302b and the second extended portion 303b have a ground potential. Thus, the first extended portion 302b and the second extended portion 303b function as a short-circuited stub (short stub) of a high frequency distributed constant element.

Since the length of the short-circuited stub varies according to the frequency of a high frequency signal that is transmitted in the semiconductor device, optimal lengths of the first extended portion 302b and the second extended portion 303b vary according to the frequency.

Accordingly, the position of the end of each extended portion 302b, 303b which is located on the opposite side from the protruding portion 301c is actually in the range from the side surface of the die pad 301 which is located on the opposite side from the protruding portion 301c to the connection position with each bonding pad 302a, 303a, and the length of each extended portion 302b, 303b is adjusted to an appropriate value. The first extended portion 302b and the second extended portion 303b may have different lengths from each other.

The first connection portion 302c and the second connection portion 303c can be formed by etching rather than press work.

As shown in FIG. 13C, in a capacitive region in which a reactance component as an impedance position after, e.g., an inductance component of a bonding wire or a lead is added is negative with respect to an input impedance position of a transistor, the short-circuited stub effectively functions to obtain 50Ω matching. FIG. 13C shows an impedance locus on an admittance chart in the case where a short-circuited stub is added.

Figure 18A:
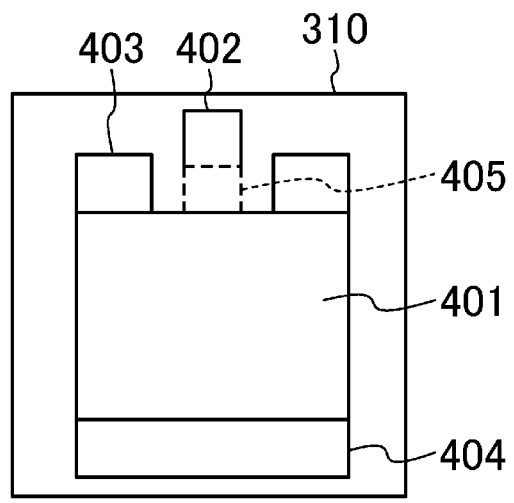
FIGS. 18A-18B are views showing arrangement of an intrinsic region and wire bonding pads which form a transistor in a semiconductor chip according to the third embodiment of the present invention.
Figure 18B:
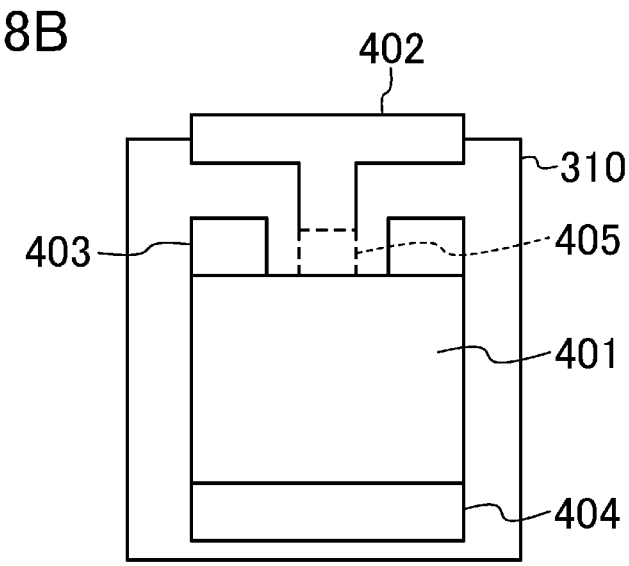

In the third embodiment, as shown in FIGS. 18A and 18B, a capacitive element portion 405 that blocks a direct current generated when a voltage is applied to a transistor need be inserted between a wire bonding gate pad 402 and an intrinsic region 401 of a semiconductor chip 310.

A chip including a capacitive element may be mounted on the die pad 301 between the semiconductor chip 310 and the first and second bonding pads 302a, 303a, rather than providing the capacitive element portion 405 between the wire bonding gate pad 402 and the intrinsic region 401 of the semiconductor chip 310. A capacitive element formed on a semiconductor substrate or a parallel plate element formed on a ceramic substrate may be used as the chip including the capacitive element.

In the present embodiment, a capacitive element is still applicable in the case where a lead having a short stub function is provided only on one side as viewed from the semiconductor chip 310. For example, in the case where only the first inner lead 302 is a lead having a short stub function, the chip including the capacitive element may be mounted between the semiconductor chip 310 and the first bonding pad 302a on the die pad 301.

The present invention is not limited to the present embodiment, and a capacitive element is similarly applicable in the case where the lead having an open stub function in the first and second embodiments is provided only on one side as viewed from the semiconductor chip 310.

(First Modification of Third Embodiment)

A semiconductor device according to a first modification of the third embodiment of the present invention will be described with reference to FIGS. 19A-19B.

Figure 19A:
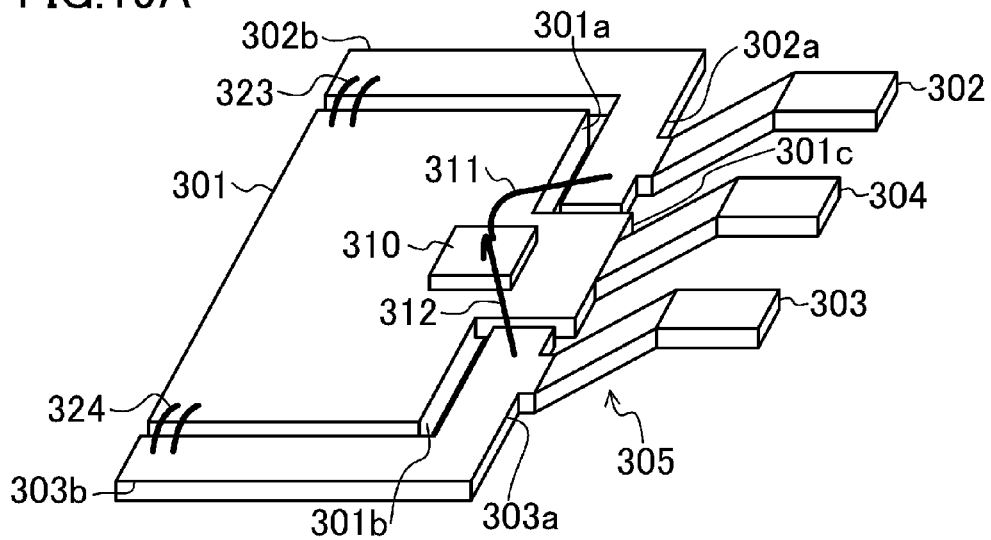
FIG. 19A is a perspective view showing a semiconductor device before resin sealing according to a first modification of the third embodiment of the present invention.
Figure 19B:
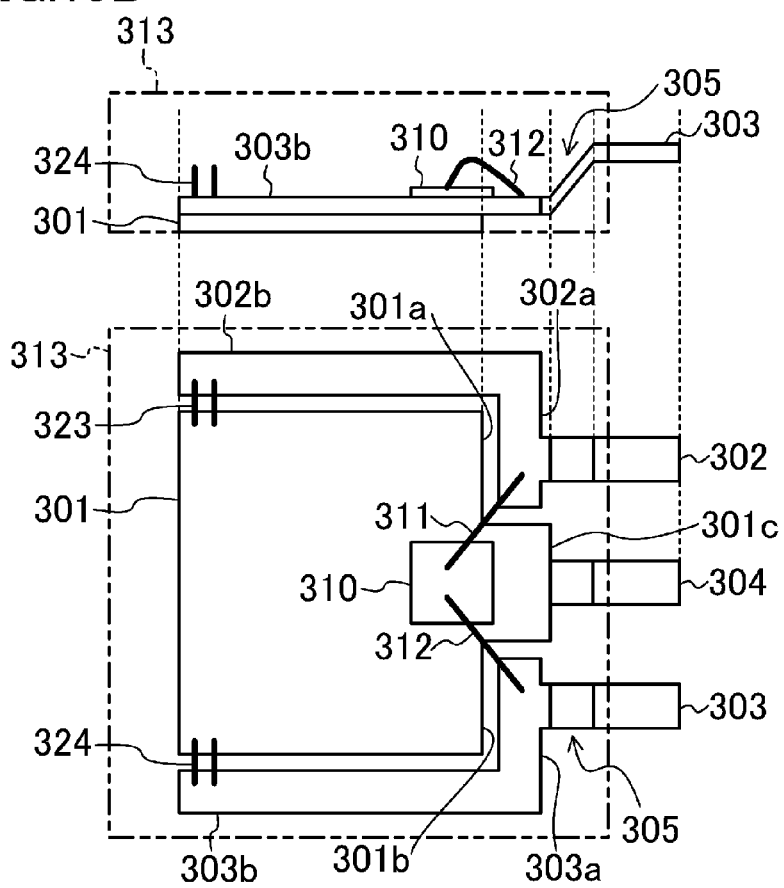
FIG. 19B shows a side view and a plan view of FIG. 19A.

As shown in FIGS. 19A-19B, in a lead frame according to the third embodiment, the end of the first extended portion 302b of the first bonding pad 302a and the end of the second extended portion 303b of the second bonding pad 303a are electrically connected to the die pad 301 by a third wire 323 and a fourth wire 324 rather than by the protruding connection portions 302c, 303c, respectively.

In this case as well, in the case where the die pad 301 has a ground potential, the first extended portion 302b and the second extended portion 303b function as a short-circuited stub of a high frequency distributed constant element. The operation principle and specific configuration of the short-circuited stub are as described in the third embodiment.

Each of the third wire 323 and the fourth wire 324 may be connected at any position on the side surface of the die pad 301 which faces the extended portion 302b, 303b. Advantages similar to those of the third embodiment can be obtained even if the wire is provided at a plurality of positions on the side surface of the die pad 301 which faces the extended portion.

(Second Modification of Third Embodiment)

A semiconductor device according to a second modification of the third embodiment of the present invention will be described with reference to FIG. 20.

Figure 20:
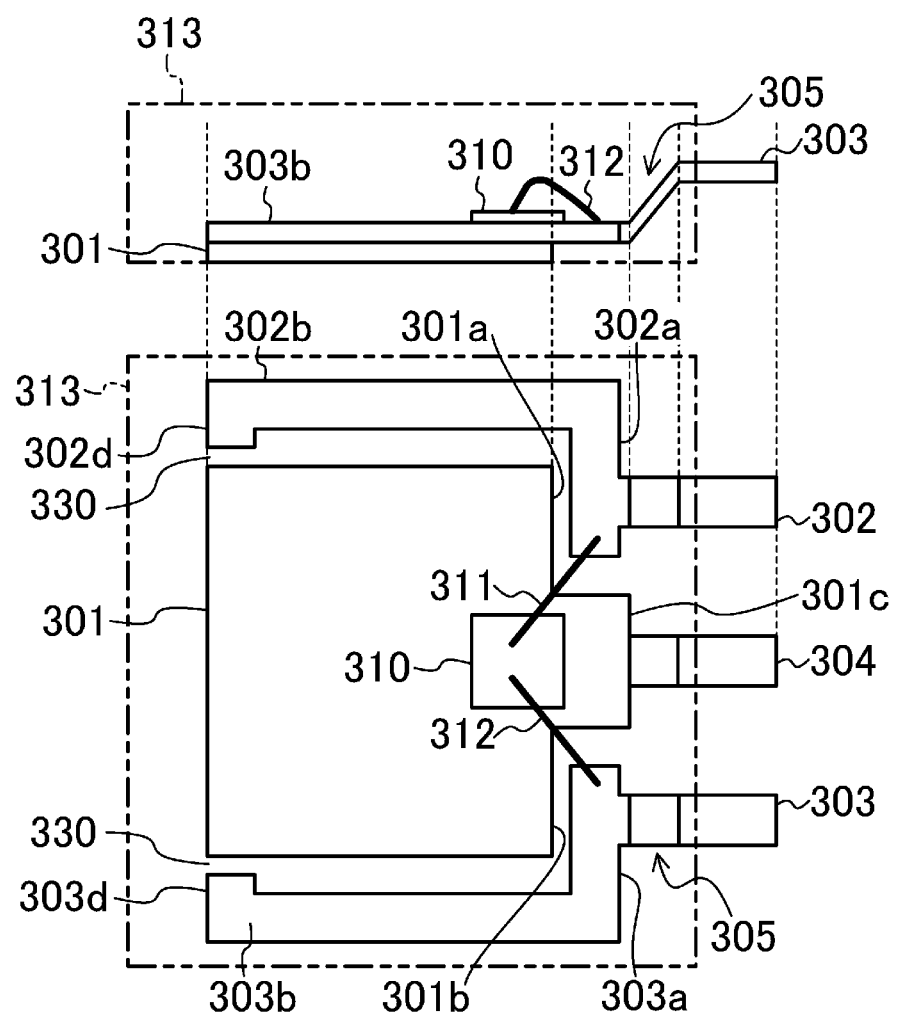
FIG. 20 shows a side view and a plan view showing a semiconductor device before resin sealing according to a second modification of the third embodiment of the present invention.

As shown in FIG. 20, in a lead frame according to the second modification, a first flange portion 302d and a second flange portion 303d are provided at the end of the first extended portion 302b of the first bonding pad 302a and the end of the second extended portion 303b of the second bonding pad 303a. Each of the first flange portion 302d and the second flange portion 303d protrudes toward the side surface of the die pad 301 with a clearance 330 therebetween.

The clearance 330 between each flange portion 302d, 303d and the die pad 301 is filled with a sealing resin material. The sealing resin material filling the clearance 330 produces a capacitance component in each flange portion 302d, 303d. Due to this capacitance component, the first extended portion 302b and the second extended portion 303b function as a short-circuited stub (short stub) of a high frequency distributed constant element.

The capacitive element portion 405 that blocks a DC component (DC block) as in the first modification of the third embodiment is not necessarily required in the second modification.

The operation principle and specific configuration of the short-circuited stub are as described in the third embodiment, and advantages similar to those of the third embodiment can be obtained.

Although it depends on the frequency to be used, the size of the clearance 330 between each flange portion 302d, 303d and the side surface of the die pad 301 is preferably about 30% to 80% of the distance between each extended portion 302b, 303b and the side surface of the die pad 301 which faces the extended portion 302b, 303b. Specifically, the size of the clearance 330 is about 0.3 mm to 0.4 mm.

(Third Modification of Third Embodiment)

A semiconductor device according to a third modification of the third embodiment of the present invention will be described with reference to FIG. 21.

Figure 21:
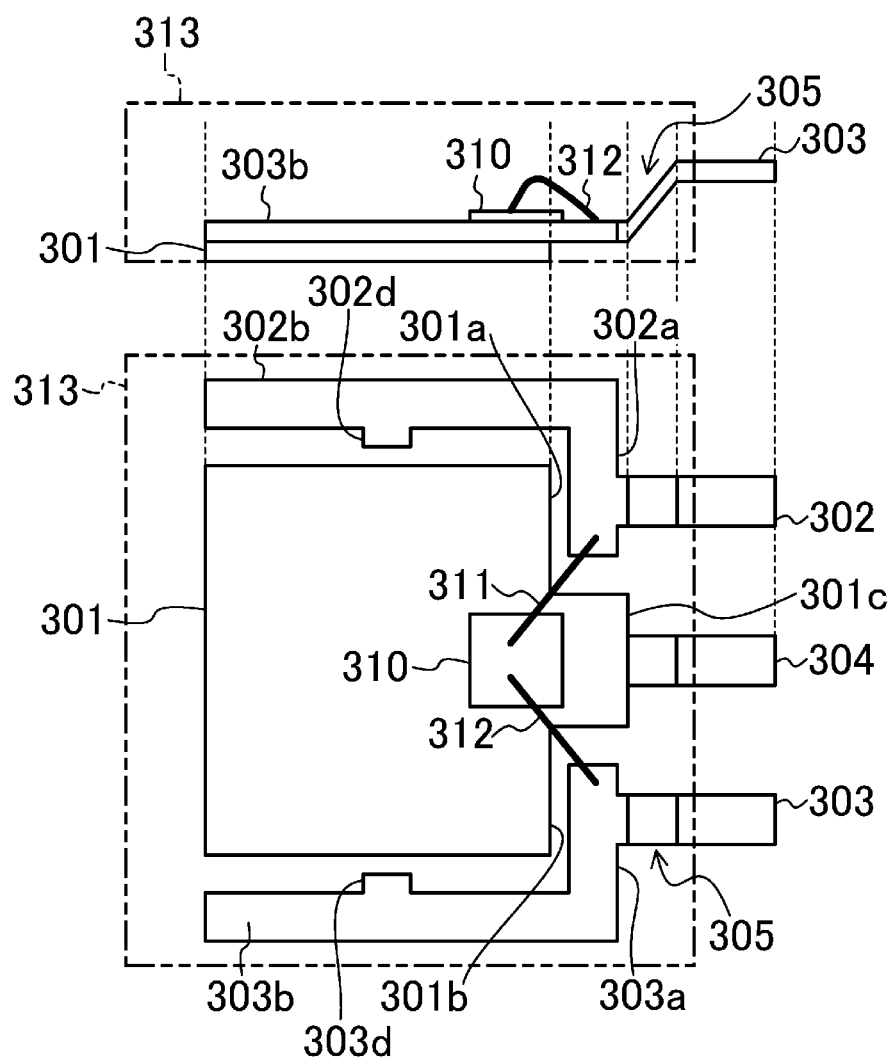
FIG. 21 shows a side view and a plan view showing a semiconductor device before resin sealing according to a third modification of the third embodiment of the present invention.

As shown in FIG. 21, in the third modification, each flange portion 302d, 303d is provided near the central portion of the side surface of the die pad 301 which faces the extended portion 302b, 303b. That is, each flange portion 302d, 303d may be provided at any position on the side surface of the extended portion 302b, 303b, and advantages similar to those of the third embodiment can be obtained even if the flange portion is provided at a plurality of positions on the side surface of the die pad 301 which faces the extended portion.

(Fourth Modification of Third Embodiment)

A semiconductor device according to a fourth modification of the third embodiment of the present invention will be described with reference to FIGS. 22A-22B.

Figure 22A:
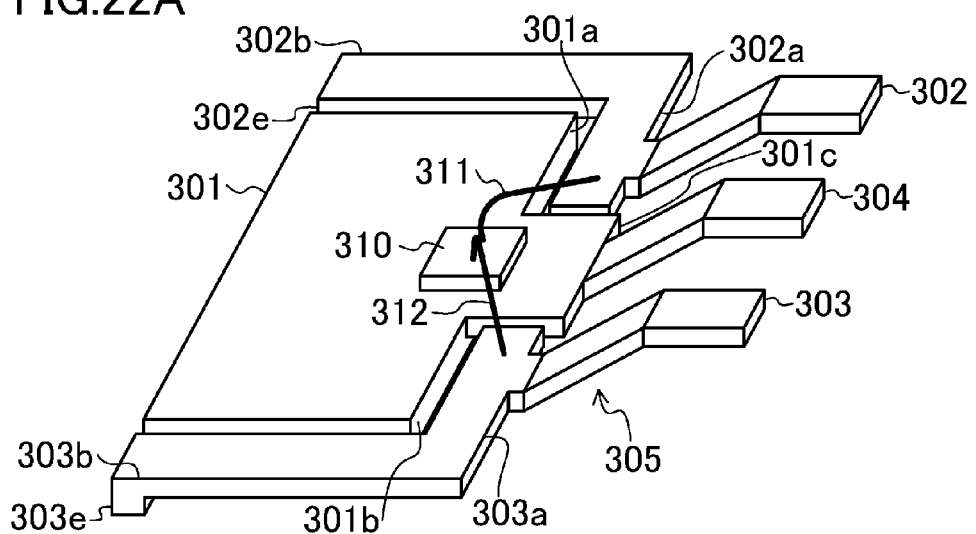
FIG. 22A is a perspective view showing a semiconductor device before resin sealing according to a fourth modification of the third embodiment of the present invention.
Figure 22B:
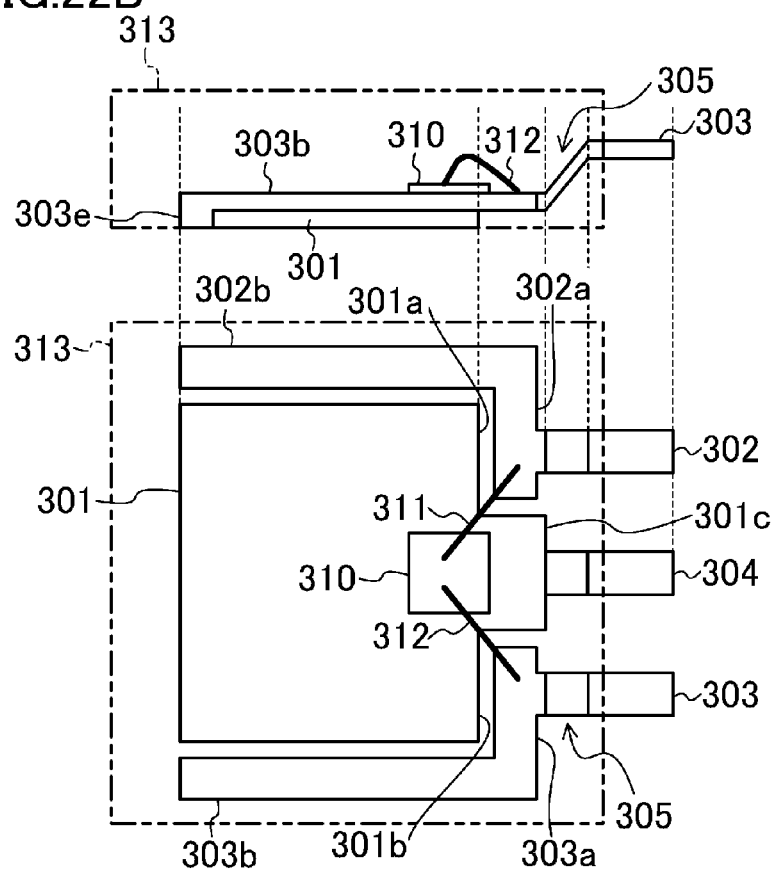
FIG. 22B shows a side view and a plan view of FIG. 22A.

As shown in FIGS. 22A-22B, in a lead frame according to the fourth modification, a first protruding portion 302e and a second protruding portion 303e which protrude downward are provided at the end of the first extended portion 302b of the first bonding pad 302a and the end of the second extended portion 303b of the second bonding pad 303a. The protruding portions 302e, 303e can be formed by, e.g., bending etc.

The lower surfaces of the protruding portions 302e, 303e are formed so as to be located at the same height as the lower surface of the die pad 301. Accordingly, when this lead frame is sealed with a sealing resin material in a resin sealing region 313, not only the rear surface of the die pad 301 but also the lower surfaces of the protruding portions 302e, 303e are exposed from the sealing resin material.

When the die pad 301, the first protruding portion 302e, and the second protruding portion 303e in the package according to the fourth modification are electrically connected to a ground pad on a board in a high frequency circuit section in a system or set by soldering etc., both the first protruding portion 302e and the second protruding portion 303e have a ground potential. Thus, the first extended portion 302b of the first inner lead 302 and the second extended portion 303b of the second inner lead 303 function as a short-circuited stub (short stub) of a high frequency distributed constant element. The operation principle and specific configuration of the short-circuited stub are as described in the third embodiment.

(Fifth Modification of Third Embodiment)

A semiconductor device according to a fifth modification of the third embodiment of the present invention will be described with reference to FIG. 23.

Figure 23:
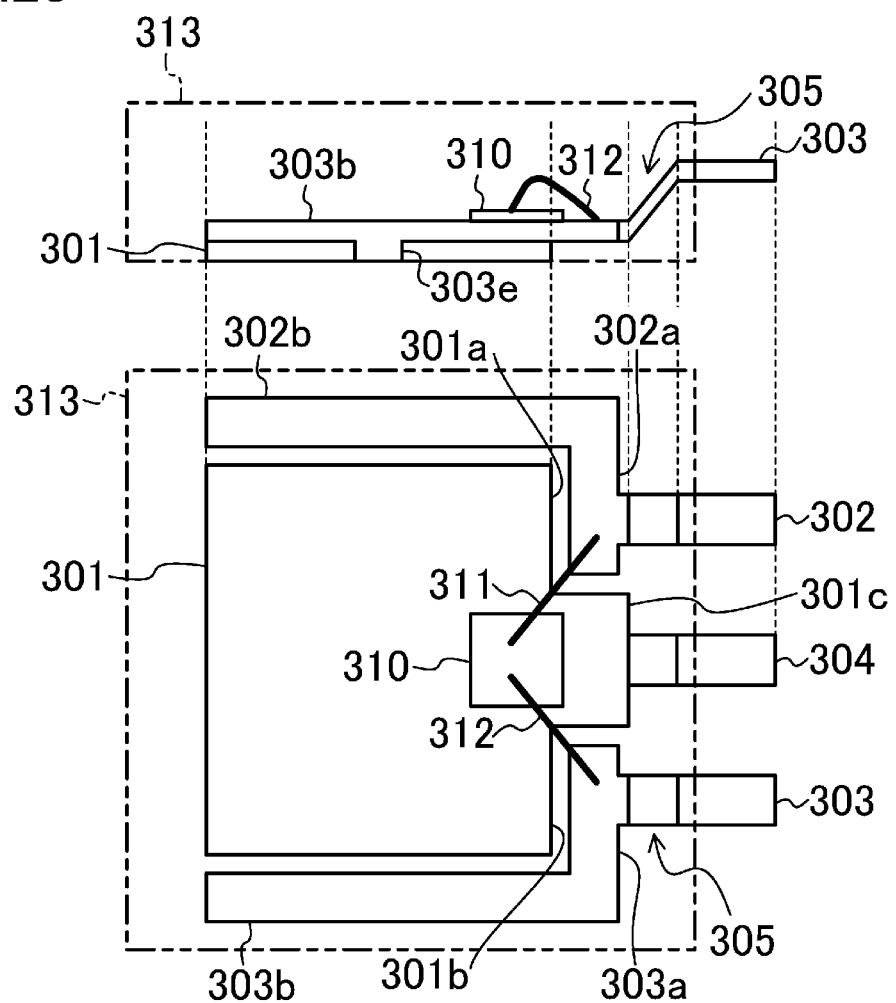
FIG. 23 shows a side view and a plan view showing a semiconductor device before resin sealing according to a fifth modification of the third embodiment of the present invention.

As shown in FIG. 23, in the fifth modification, each protruding portion 302e, 303e is provided near the central portion of the side surface of the die pad 301 which faces the extended portion 302b, 303b. That is, each protruding portion 302e, 303e may be provided at any position on the lower surface of the extended portion 302b, 303b, and advantages similar to those of the third embodiment can be obtained even if the protruding portion is provided at a plurality of positions on the lower surface of the extended portion.

(Sixth Modification of Third Embodiment)

A semiconductor device according to a sixth modification of the third embodiment of the present invention will be described with reference to FIG. 24.

Figure 24:
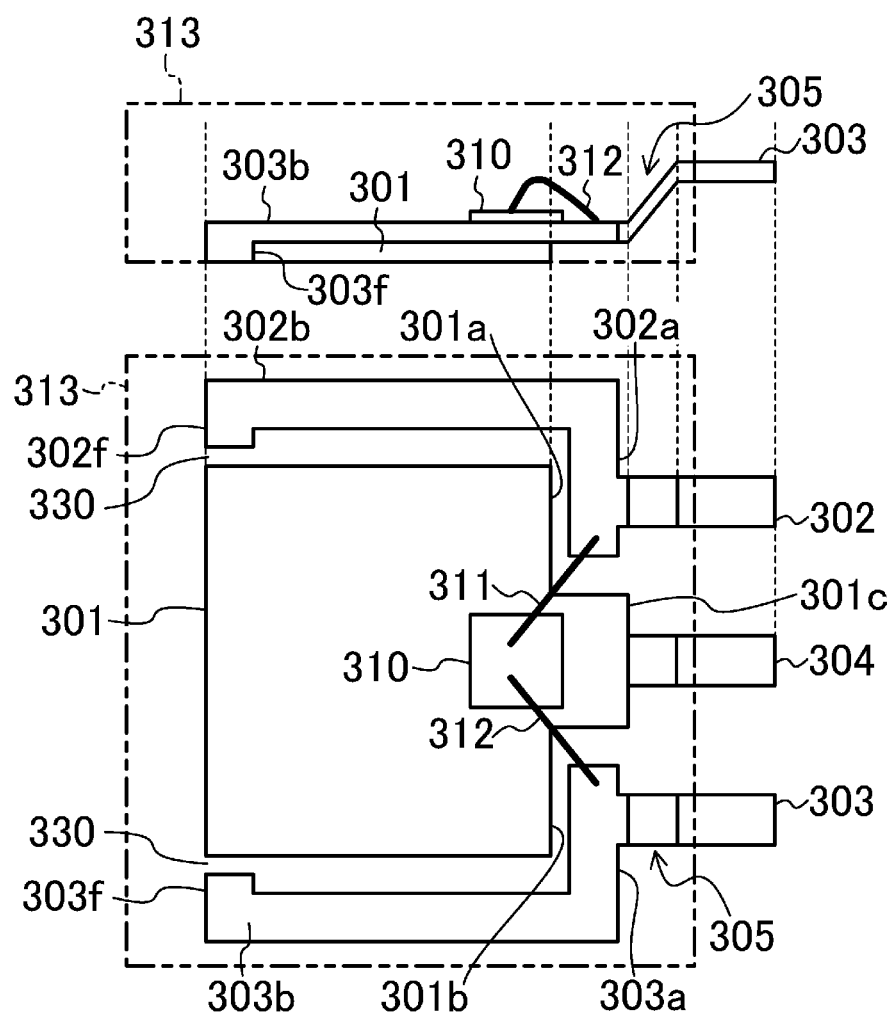
FIG. 24 shows a side view and a plan view showing a semiconductor device before resin sealing according to a sixth modification of the third embodiment of the present invention.

As shown in FIG. 24, in a lead frame according to the sixth modification, the first extended portion 302b of the first inner lead 302 has a first flange portion that is configured to produce capacitance, and the first flange portion has a protruding portion to form a first ground flange portion 302f. Similarly, the second extended portion 303b of the second inner lead 302 has a second flange portion that is configured to produce capacitance, and the second flange portion has a protruding portion to form a second ground flange portion 303f.

With this configuration, a lead frame having a combined configuration of the second modification and the fourth modification can be obtained. Accordingly, the lead frame according to the sixth modification has combined advantages of the second modification and the fourth modification.

Each ground flange portion 302f, 303f may be provided at any position on the extended portion 302b, 303b, and the ground flange portion may be provided at a plurality of positions on the extended portion 302b, 303b.

The planar shape according to the first or second modification of the second embodiment is applied to the inner leads 302, 303 of the sixth modification.

(Seventh Modification of Third Embodiment)

A semiconductor device according to a seventh modification of the third embodiment of the present invention will be described with reference to FIGS. 25A-25B.

Figure 25A:
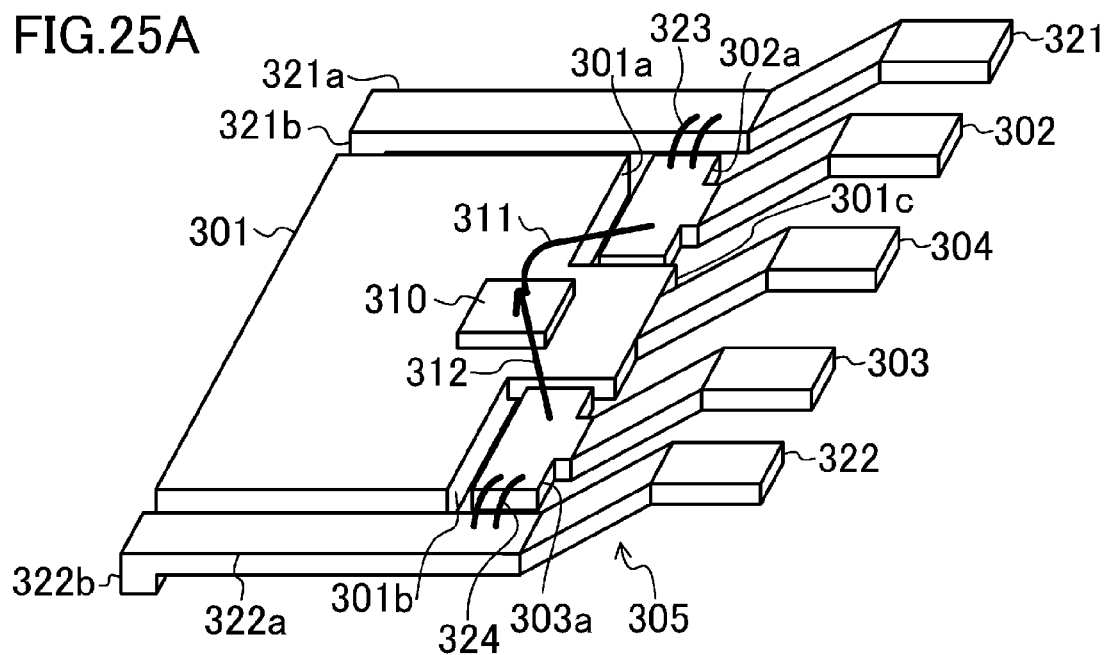
FIG. 25A is a perspective view showing a semiconductor device before resin sealing according to a seventh modification of the third embodiment of the present invention.
Figure 25B:
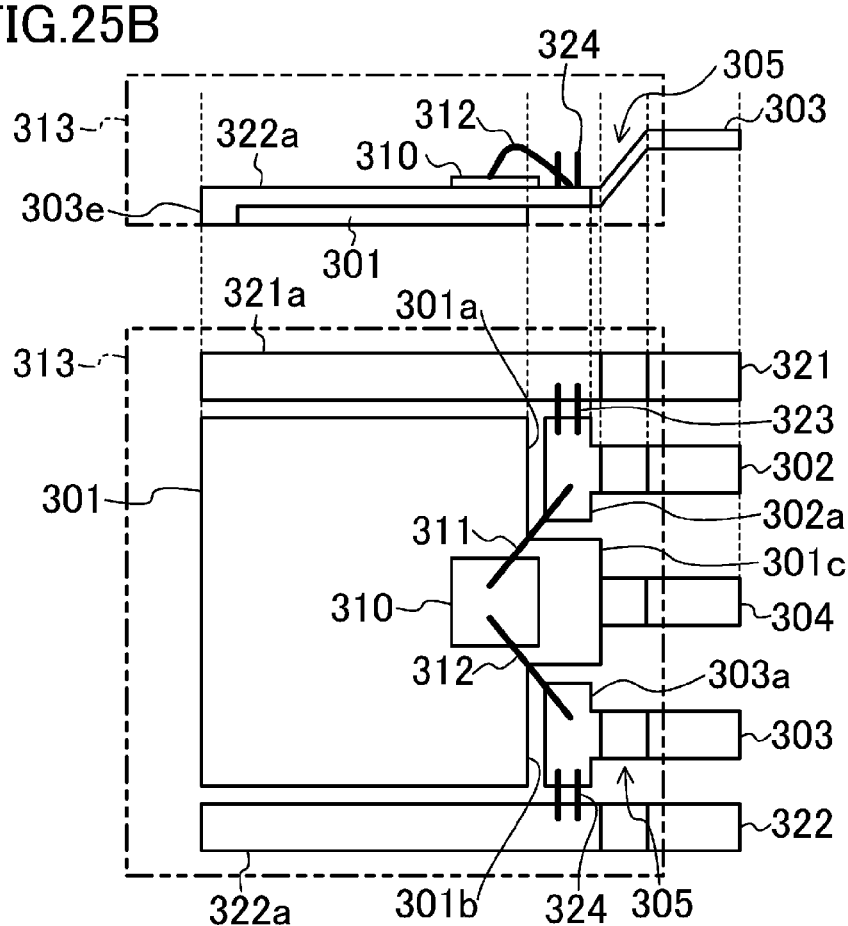
FIG. 25B shows a side view and a plan view of FIG. 25A.

As shown in FIGS. 25A-25B, a lead frame according to the seventh modification is a modification of the fourth modification, and is formed so that a short-circuited stub (short stub) is not formed integrally with the bonding pads 302a, 303a, but is formed as a third inner lead 321 and a fourth inner lead 322 which are separate from the bonding pads 302a, 303a.

Specifically, the third inner lead 321 has a first extended portion 321a located outside the first inner lead 302 and extending parallel to the side surface of the die pad 301. The fourth inner lead 322 has a second extended portion 322a located outside the second inner lead 303 and extending parallel to the side surface of the die pad 301. A first protruding portion 321b and a second protruding portion 322b which protrude downward are provided at the end of the first extended portion 321a of the third inner lead 321 and the end of the second extended portion 322a of the second inner lead 322.

The lower surface of each protruding portion 321b, 322b formed so as to be located at the same height as the lower surface of the die pad 301. Accordingly, when this lead frame is sealed with a sealing resin material in the resin sealing region 313, not only the rear surface of the die pad 301 but also the lower surfaces of the protruding portions 321b, 322b are exposed from the sealing resin material.

When the die pad 301, the first protruding portion 321b, and the second protruding portion 322b in the package according to the seventh modification are electrically connected to a ground pad on a board in a high frequency circuit section in a system or set by soldering etc., both the first protruding portion 321b and the second protruding portion 322b have a ground potential. Thus, the first extended portion 321b of the third inner lead 321 and the second extended portion 322a of the fourth inner lead 322 function as a short-circuited stub (short stub) of a high frequency distributed constant element. The operation principle and specific configuration of the short-circuited stub are as described in the third embodiment.

Each protruding portion 321b, 322b may be provided at any position on the lower surface of the extended portion 321a, 322a, and advantages similar to those of the third embodiment can be obtained even if the protruding portion is provided at a plurality of positions on the lower surface of the extended portion.

In the seventh modification, the protruding portions 321b, 322b are provided on the first extended portion 321a of the third inner lead 321 and the second extended portion 322a of the fourth inner lead 322 so as to protrude downward from the lower surfaces of the first extended portion 321a and the second extended portion 322a. Instead of providing such protruding portions 321b, 322b, connection portions connecting to the side surfaces of the die pad 301 may be provided at any positions as shown in FIGS. 17A-17B so that the first extended portion 321a and the second extended portion 322a have a ground potential.

The configuration in which the third wire 323 and the fourth wire 324 are connected to the extended portions 302b, 303b as in the first modification of the third embodiment, the configuration in which the flange portions 302d, 303d are provided on the extended portions 302b, 303b as in the second and third modifications of the third embodiment, and the configuration of the seventh modification of the third embodiment are applicable in the case where the entire lead frame is formed by a thin plate member having a uniform thickness of about 0.4 mm to 0.5 mm as in the fifth modification of the first embodiment.

The method for manufacturing a lead frame according to the first embodiment is applicable as a method for manufacturing a lead frame according to the third embodiment and its modifications.

In the third modification and its modifications, the planar shapes of FIGS. 9A-9B and 10A-10B are applicable to the cutout portions 301a, 301b formed in the die pad 301.

(Fourth Embodiment)

A semiconductor device according to a fourth embodiment of the present invention will be described with reference to FIGS. 26A-26B.

Figure 26A:
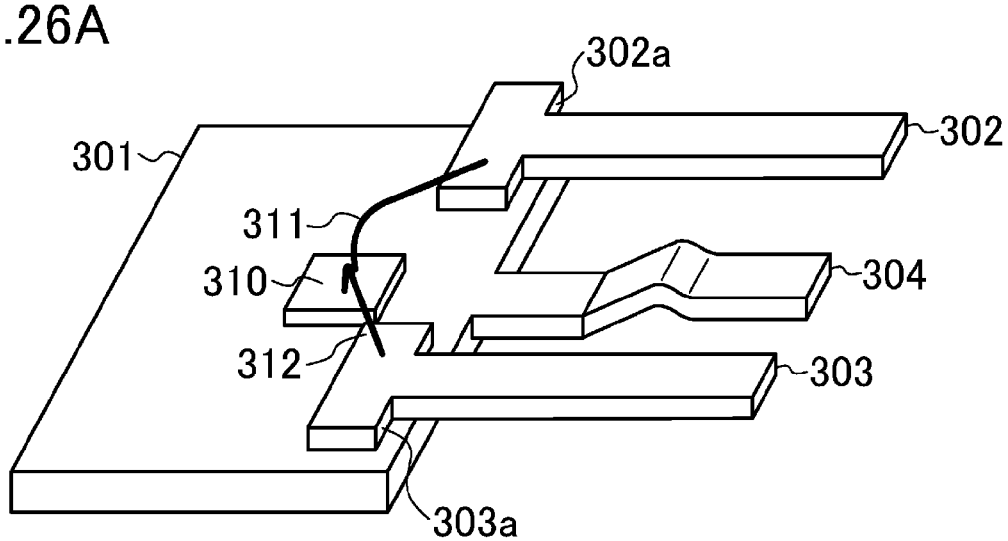
FIG. 26A is a perspective view showing a semiconductor device before resin sealing according to a fourth embodiment of the present invention.
Figure 26B:
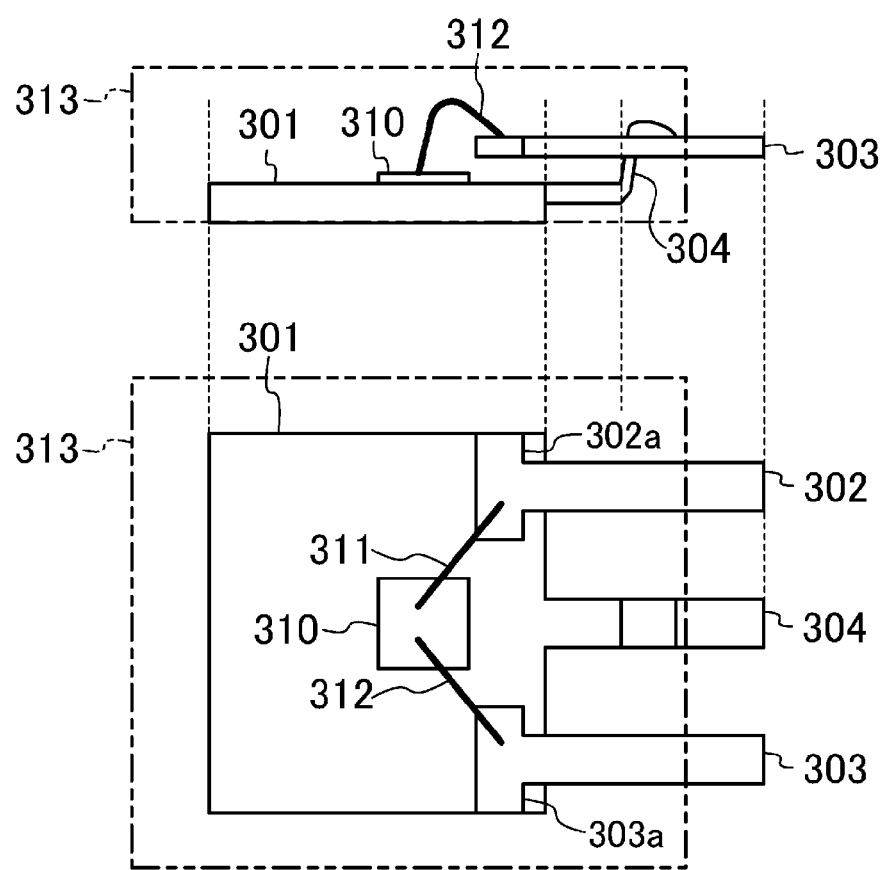
FIG. 26B shows a side view and a plan view of FIG. 26A.

As shown in FIG. 26A, the semiconductor device according to the fourth embodiment is in the form of a resin-sealed package that holds a semiconductor chip 310 on a lead frame.

The lead frame according to the fourth embodiment is formed as an irregular-shaped frame having a thick plate portion with a thickness of about 1 mm to 2 mm and a thin plate portion with a thickness of about 0.4 mm to 0.5 mm, and being mainly composed of copper (Cu).

A die pad 301 that holds the semiconductor chip 310 on its upper surface by a die bonding material is formed in the thick plate portion, and a first inner lead 302, a second inner lead 303, and a suspension lead 304 are formed in the thin plate portion. A first bonding pad 302a and a second bonding pad 303a, which are wider than the inner leads 302, 303, are provided at the ends on the die pad 301 side of the first inner lead 302 and the second inner lead 303, respectively.

A feature of the fourth embodiment is that the bonding pads 302a, 303a are formed above the die pad 301 so as to overlap (cross) the corners of the die pad 301, instead of forming the cutout portions 301a, 301b in the die pad 301 so that the first bonding pad 302a of the first inner lead 302 and the second bonding pad 303a of the second inner lead 303 are placed at an interval from the die pad 301.

The interval between the upper surface of the die pad 301 and the lower surface of each bonding pad 302a, 303a substantially corresponds to the thickness of the thin plate portion.

The semiconductor chip 310 as, e.g., a high frequency device is fixed to the upper surface of the die pad 301 by a die bonding material. Wire bonding pads (see FIGS. 2A-2B) formed on the upper surface of the semiconductor chip 310 are electrically connected to the bonding pads 302a, 303a of the first and second inner leads 302, 303 by first and second wires 311, 312, respectively. The wires 311, 312 have substantially the same length.

The semiconductor chip 310 may be die-bonded at any desired position on the die pad 301 according to the case where it is desired to reduce the length of the wires 311, 312 or the case where it is desired for the plurality of wires to have the same length. In either case, however, the die bonding position is determined so that the center position of the semiconductor chip 310 is located on the bonding pad 302a, 303a side with respect to the center position of the die pad 301. The member described in the first embodiment can be used as a die bonding material. Although only one wire 311 and only one wire 312 are provided in FIGS. 26A and 26B, two or more wires 311 and two or more wires 312 may be provided in order to reduce inductance, to increase allowable current carrying capacity, etc.

The semiconductor chip 310 may use, e.g., a hetero-junction field effect transistor (HFET) comprised of a gallium nitride (GaN)-based compound semiconductor. The semiconductor chip 310 has a thickness of about 100 μm.

The semiconductor chip 310 is not limited to the GaN-based semiconductor, and other transistors shown in the first embodiment may be used.

In the fourth embodiment as well, the die pad 301 including the semiconductor chip 310 and the bonding pads 302a, 303a are sealed with a sealing resin material such as epoxy in a resin sealing region 313. In this case, the surface (rear surface) of the die pad 301, which is located on the opposite side from the semiconductor chip 310, is exposed without being covered by the sealing resin material. This exposed portion of the die pad 301 plays an important role as a ground terminal or a heat dissipation path after a high frequency device or a power device is mounted on the die pad 301. The exposed portion is electrically connected to a ground pad on a board in a high frequency circuit section in a system or set by soldering etc.

A region below the first bonding pad 302a of the inner lead 302 and a region below the second bonding pad 303a of the inner lead 303 are filled with the sealing resin material as a dielectric material. Accordingly, if the rear surface of the die pad 301 which is exposed from the sealing resin material is electrically connected to the ground pad on the board in the high frequency circuit section in the system or set by soldering etc., the sealing resin material filling the region below each inner lead 302, 303 serves as a ground capacitance component, i.e., a parallel capacitance component. Since this parallel capacitance component performs a pre-matching function, impedance close to 50Ω can be implemented as the impedance at the lead ends of the package.

As the interval between each of the wires 311, 312 electrically connecting the bonding pads 302a, 303a to the semiconductor chip 310 on the die pad 301 and the die pad 301 functioning as a ground potential surface is reduced, a ground capacitance component, namely a parallel capacitance component increases. Since this parallel capacitance component converts transistor impedance from low impedance to high impedance, high frequency loss from the semiconductor chip to outer leads is reduced. Moreover, impedance close to 50Ω can be implemented as the impedance at the lead ends of the package by the pre-matching function of the capacitance component.

As described above, according to the fourth embodiment, the wire length from each pad of the semiconductor chip 310 to the bonding pad 302a, 303a of the inner lead 302, 303 is reduced, and each wire has the same length. This can reduce the parasitic inductance component of the inner lead 302, 303 itself.

Moreover, since the ground capacitance component of the wire 311, 312 and the inner lead 302, 303 increases, high frequency loss from the semiconductor chip to the outer leads can be reduced. As a result, a resin molded package of a high-performance high-output power amplifier can be implemented.

The fourth embodiment further has the following advantage. The configuration of the fourth embodiment can reduce the number of external chip capacitive elements, resistive elements, and inductors that are provided to achieve 50Ω matching in the case where the semiconductor device (package) is mounted on the board in the high frequency circuit section in the system or set. The configuration of the fourth embodiment can also deal with impedance matching in a broad frequency band.

(Manufacturing Method)

An example of a manufacturing method of the lead frame according to the fourth embodiment will be described below with reference to FIGS. 27A-27D.

Figure 27A:
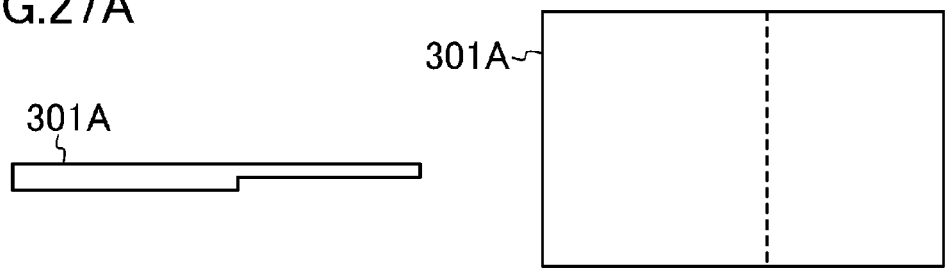
FIGS. 27A-27D show side views and plan views sequentially illustrating an example of a method for manufacturing a lead frame of a semiconductor device according to the fourth embodiment of the present invention.
Figure 27B:
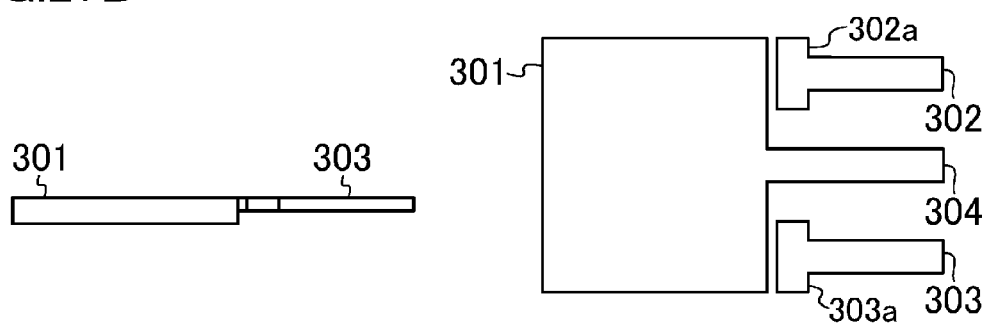

First, as shown in FIG. 27A, a die pad 301, a first inner lead 302, a second inner lead 303, and a suspension lead 304 as shown in FIG. 27B are formed by punching of a metal plate 301A having a thick plate portion and a thin plate portion by using stamping. The lead frame need not necessarily be formed by the stamping, but may be formed by etching if the thickness of the lead frame is large enough to be able to be formed by etching. Next, portions of the first inner lead 302, the second inner lead 303, and the die pad 301 are plated with silver as required. A chamfered shape formed by chamfering or obliquely cutting off edges or corners, or a complex transverse sectional shape such as a recess can be formed in at least either each inner lead 302, 303 or in the die pad 301 by the stamping.

Figure 27C:
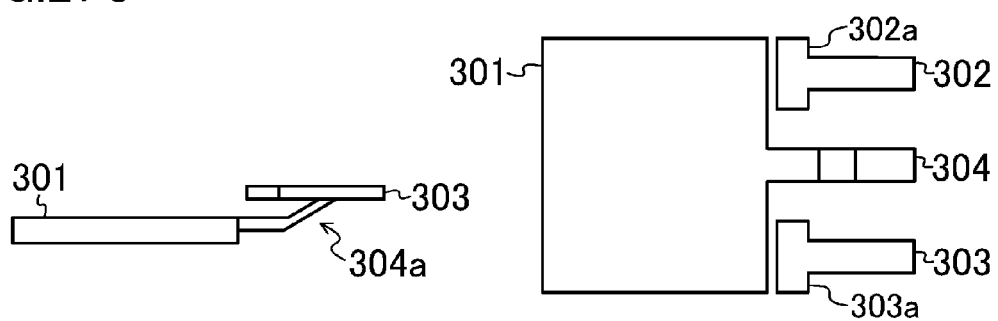

Then, as shown in FIG. 27C, a first bent portion 304a that is bent upward in a crank shape at a small bend angle is formed in the suspension lead 304 by, e.g., press work. Thus, the inner leads 302, 303 and the outer lead side of the suspension lead 304 are moved to a position above the upper surface of the die pad 301. At this stage, the inner leads 302, 303 and the suspension lead 304 are connected to each other by a lead frame, not shown. In this example, the first bent portion 304a is formed so as to be longer in a direction parallel to the upper surface of the die pad 301 as compared to the bending in the manufacturing method shown in FIG. 3C.

Figure 27D:
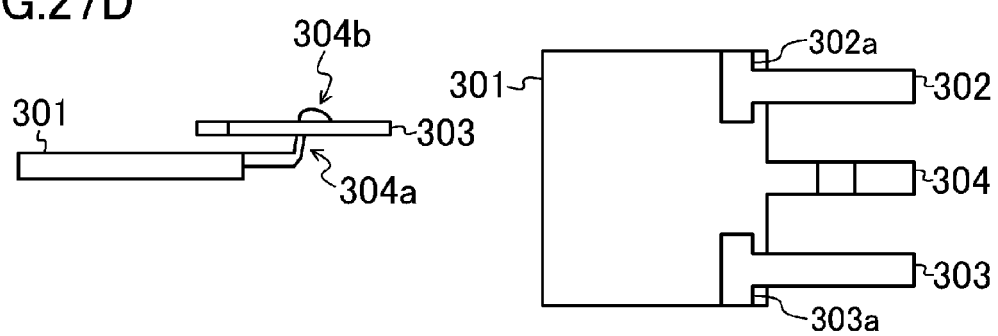

Subsequently, as shown in FIG. 27D, a second bent portion 304b is formed in a portion near the first bent portion 304a in the suspension lead 304 by press work etc. so that both the first inner lead 302 and the second inner lead 303 are moved in the direction parallel to the upper surface of the die pad 301 and placed above the die pad 301.

Then, although not shown in the figure, a semiconductor chip 310 is fixed to a predetermined position on the upper surface of the die pad 301, as in the first embodiment. Specifically, as shown in FIG. 26B, the semiconductor chip 310 is fixed such that its center position is located on the bonding pad 302a, 303a side with respect to the center position of the die pad 301. Thereafter, a wire bonding gate pad 402 and a wire bonding drain pad 404 on the semiconductor chip 310 shown in FIGS. 2A-2B are electrically connected to the bonding pads 302a, 303a by a first wire 311 and a second wire 312, respectively. Then, a resin sealing region 313 is sealed with a sealing resin material such as epoxy. The second bent portion 304b of the suspension lead 304 may be exposed from the resin sealing region 313. The present embodiment also uses the layout shown in FIGS. 2A-2B, in which the bonding pad 302a shown in FIGS. 26A-26B is placed as a gate bonding pad and the bonding pad 303a is placed as a drain bonding side, with the source being grounded.

Then, outer leads of the first inner lead 302 and the second inner lead 303 are plated with tin (Sn) etc. These outer leads are cut off from the surrounding frame to obtain a desired semiconductor device.

Since this manufacturing method has the following three advantages, a resin molded package including a high-performance high-output power amplifier can be obtained.

Firstly, in order to reduce the difference in level between the die pad and the inner leads as much as possible, the bonding pads as the ends of the inner leads are placed above the die pad to reduce the distance between the semiconductor chip and the bonding pads, whereby the length of each wire can be reduced. This can reduce parasitic inductance due to wires and can reduce high frequency loss from the semiconductor chip to the outer leads.

Secondly, since the ground capacitance component of the wires and the inner leads increases, the transistor impedance is converted from low impedance to high impedance. This reduces high frequency loss from the semiconductor chip to the outer leads. Moreover, since the ground capacitance component has a pre-matching function, impedance close to 50Ω can be implemented as the impedance at the lead ends of the package. The above manufacturing method can thus reduce the number of external chip capacitive elements, resistive elements, and inductors that are mounted on a board to achieve 50Ω matching in the case where the package according to the present embodiment is mounted on the board in the high frequency circuit section in the system or set. The above manufacturing method can also deal with impedance matching in a broad frequency band.

Thirdly, the wires connecting the semiconductor chip to the bonding pads of the inner leads can be made to have the same length. Thus, a high frequency signal that is input to the semiconductor chip is in phase with a high frequency signal that is output from the semiconductor chip. This can prevent reduction in both output power and gain as a high-output power amplifier.

(First Modification of Fourth Embodiment)

A semiconductor device according to a first modification of the fourth embodiment of the present invention will be described with reference to FIGS. 28A-28B.

Figure 28A:
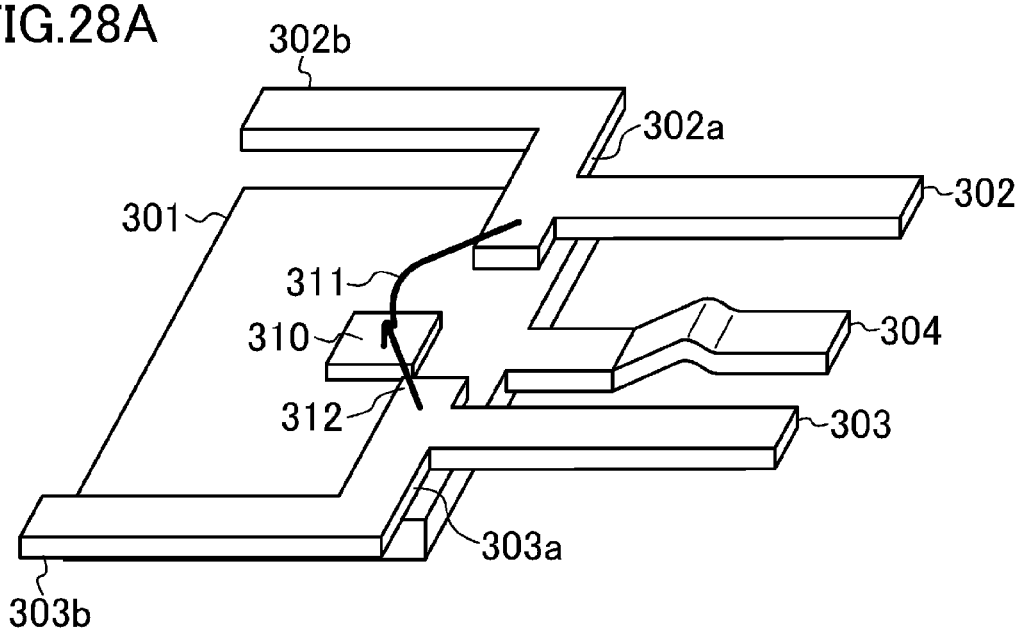
FIG. 28A is a perspective view showing a semiconductor device before resin sealing according to a first modification of the fourth embodiment of the present invention.
Figure 28B:
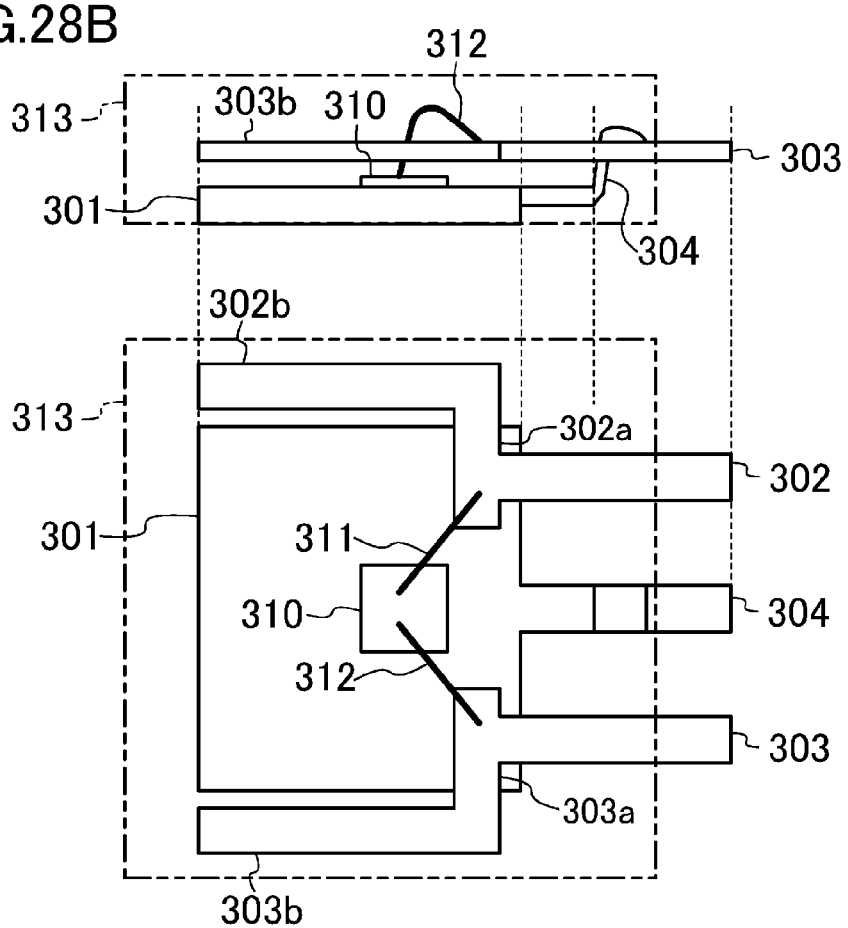
FIG. 28B shows a side view and a plan view of FIG. 28A.

As shown in FIGS. 28A-28B, a first inner lead 302 and a second inner lead 303 of a lead frame according to the first modification are provided with a first extended portion 302b and a second extended portion 303b, respectively. The first extended portion 302b and the second extended portion 303b are respectively formed by extending the outer ends of the bonding pads 302a, 303a along the opposing side surfaces (side surfaces parallel to the longitudinal direction of the inner leads) of the die pad 301 with an interval between the side surface of the die pad 301 and the extended portion 302b, 303b.

The first and second extended portions 302b, 303b function as an open-circuited stub (open stub) of a high frequency distributed constant element, and are effective in matching transistor impedance to 50 Ω.

As described in the first embodiment, if the parallel capacitance component to the ground plane increases, this parallel capacitance component contributes to 50Ω matching due to the pre-matching function.

As described in the second embodiment, frequency dependence of the parallel capacitance component is approximately equal to that of an open stub of a distributed contact element. However, the length of the open stub is equal to or less than a quarter of the wavelength as the electrical length of a desired frequency. Accordingly, since the length of the open stub varies according to the frequency of a high frequency signal that is transmitted in the semiconductor device, optimal lengths of the first extended portion 302b and the second extended portion 303b vary according to the frequency.

Accordingly, the position of the end of each extended portion 302b, 303b which is located on the opposite side from the suspension lead 304 is actually in the range from the end face of the die pad 301 which is located on the opposite side from the suspension lead 304 to the connection position with each bonding pad 302a, 303a, and the length of each extended portion 302b, 303b is adjusted to an appropriate value. The first extended portion 302b and the second extended portion 303b may have different lengths form each other.

A region below each bonding pad 302a, 303a and a region below each extended portion 302b, 303b are filled with a sealing resin material as a dielectric material. Thus, if the rear surface of the die pad 301 which is exposed from the sealing resin material is electrically connected to a ground pad on a board in a high frequency circuit section in a system or set by soldering etc., the sealing resin material filling the region below each extended portion 302b, 303b serves as a ground capacitance component, i.e., a parallel capacitance component. Since the parallel capacitance component performs a pre-matching function, impedance close to 50Ω can be implemented as the impedance at the lead ends of the package. The configuration of the first modification of the fourth embodiment can thus reduce the number of external chip capacitive elements, resistive elements, and inductors that are provided to achieve 50Ω matching in the case where the semiconductor device (package) is mounted on the board in the high frequency circuit section in the system or set. The configuration of the first modification of the fourth embodiment can also deal with impedance matching in a broad frequency band.

(Second Modification of Fourth Embodiment)

A semiconductor device according to a second modification of the fourth embodiment of the present invention will be described below with reference to FIGS. 29A-29B.

Figure 29A:
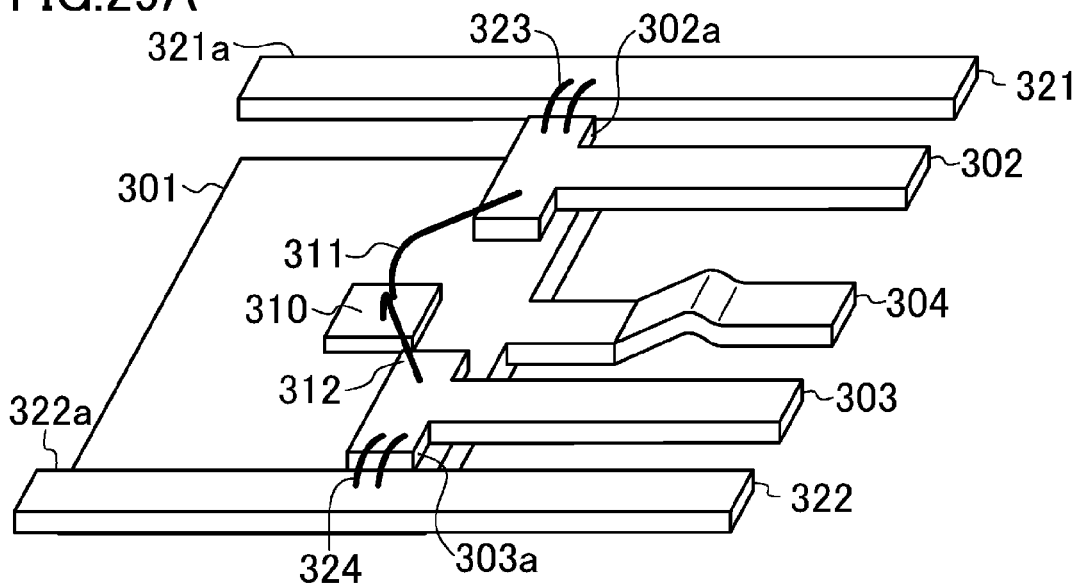
FIG. 29A is a perspective view showing a semiconductor device before resin sealing according to a second modification of the fourth embodiment of the present invention.
Figure 29B:
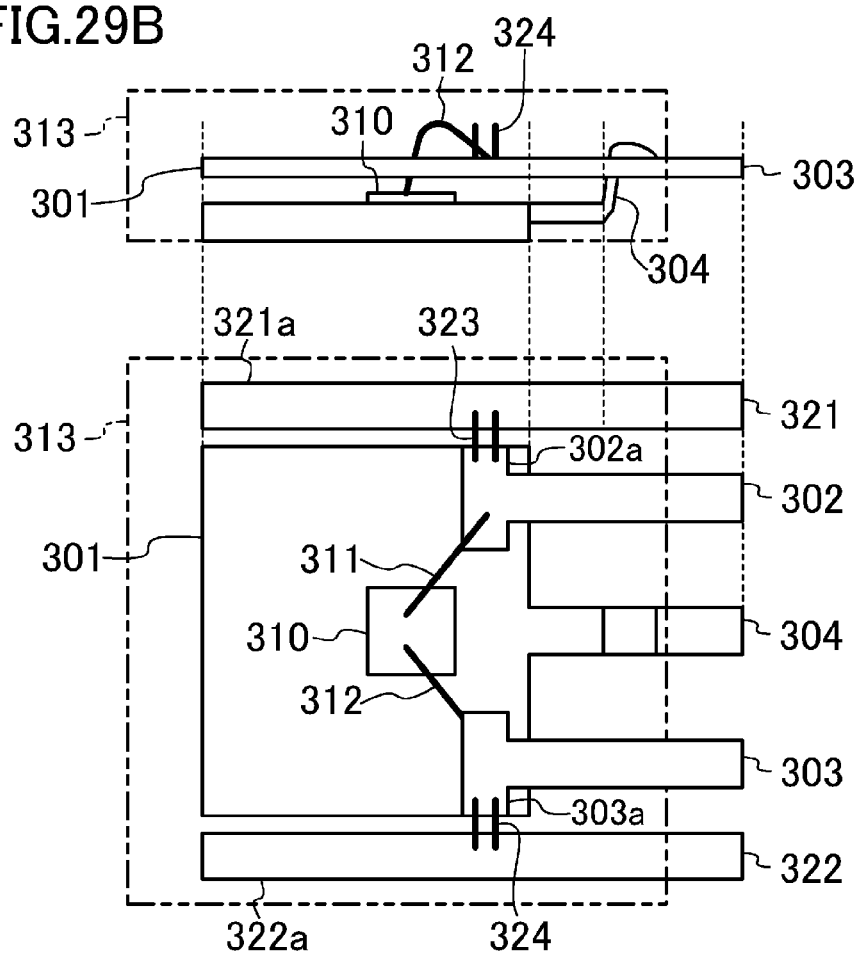
FIG. 29B shows a side view and a plan view of FIG. 29A.

As shown in FIGS. 29A-29B, a lead frame according to the second modification is formed so that an open-circuited stub (open stub) is not formed integrally with the bonding pads 302a, 303a, but is formed as a third inner lead 321 and a fourth inner lead 322 which are separate from the bonding pads 302a, 303a.

Specifically, the third inner lead 321 has a first extended portion 321a located outside the first inner lead 302 and extending parallel to the side surface of the die pad 301.

The fourth inner lead 322 has a second extended portion 322a located outside the second inner lead 303 and extending parallel to the side surface of the die pad 301.

In order for the first extended portion 321a of the third inner lead 321 to function as an open-circuited stub of a high frequency distributed constant element, the third inner lead 321 is electrically connected to the first bonding pad 302a by a third wire 323. Similarly, the fourth inner lead 322 is electrically connected to the second bonding pad 303a by a fourth wire 324.

When this package is mounted on a board in a high frequency circuit section in a system or set, the outer lead sides of the third inner lead 321 and the fourth inner lead 322 may be non-connection (NC). If a chip capacitive element etc. is electrically connected, the chip capacitive element functions as the pre-matching function described above.

(Third Modification of Fourth Embodiment)

A semiconductor device according to a third modification of the fourth embodiment of the present invention will be described with reference to FIGS. 30A-30B.

Figure 30A:
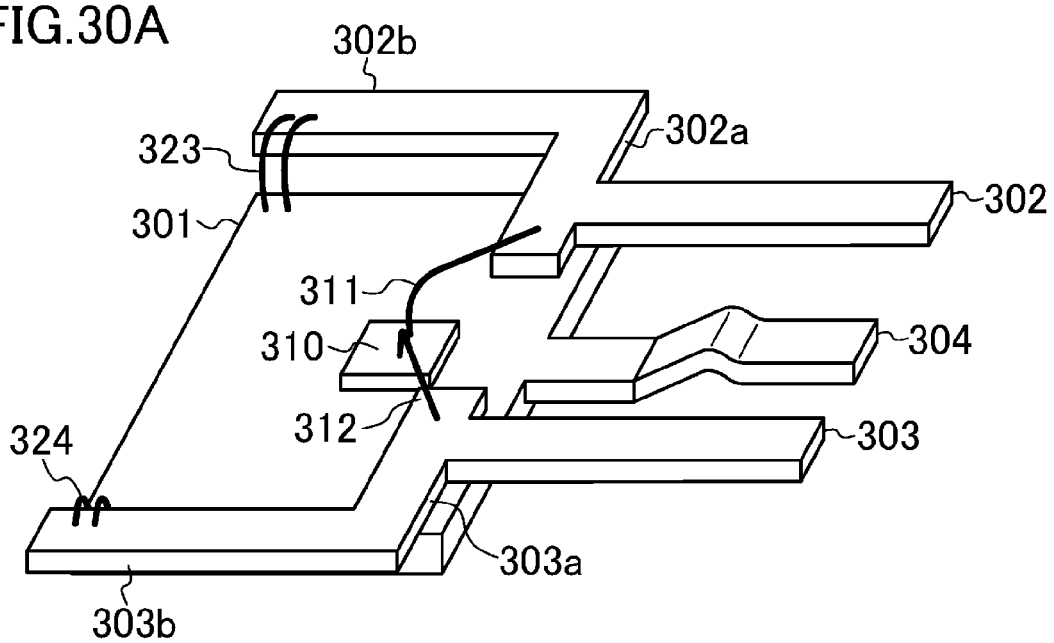
FIG. 30A is a perspective view showing a semiconductor device before resin sealing according to a third modification of the fourth embodiment of the present invention.
Figure 30B:
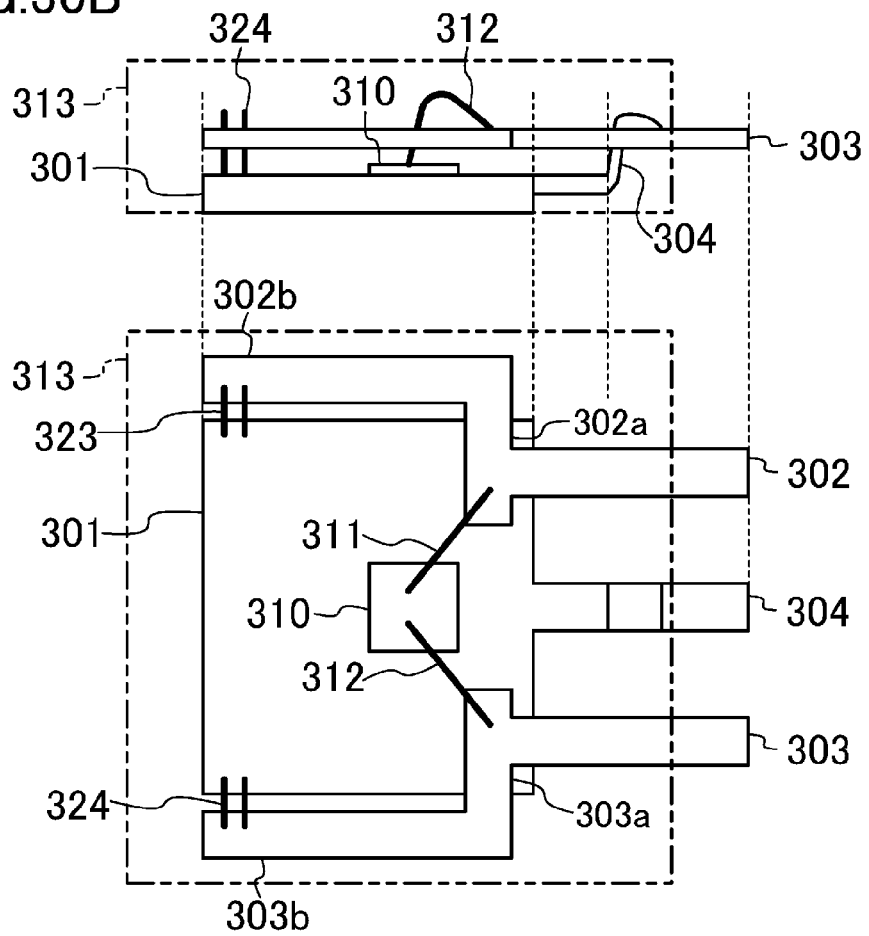
FIG. 30B shows a side view and a plan view of FIG. 30A.

As shown in FIGS. 30A-30B, in a lead frame according to the third modification, the end of the first extended portion 302b of the first bonding pad 302a and the end of the second extended portion 303b of the second bonding pad 303a are electrically connected to the die pad 301 by a third wire 323 and a fourth wire 324, respectively.

As a package, if the die pad 301 exposed from a sealing resin material is electrically connected to a ground pad on a board in a high frequency circuit section in a system or set by soldering etc., both the first extended portion 302b and the second extended portion 303b have a ground potential. Thus, the first extended portion 302b and the second extended portion 303b function as a short-circuited stub (short stub) of a high frequency distributed constant element.

The operation principle and specific configuration of the short-circuited stub are as described in the third embodiment.

Each wire 323, 324 may be provided at any position on the extended portion 302b, 303b, and similar advantages can be obtained even if the wire is provided at a plurality of positions on the extended portion.

(Fourth Modification of Fourth Embodiment)

A semiconductor device according to a fourth modification of the fourth embodiment of the present invention will be described with reference to FIGS. 31A-31B.

Figure 31A:
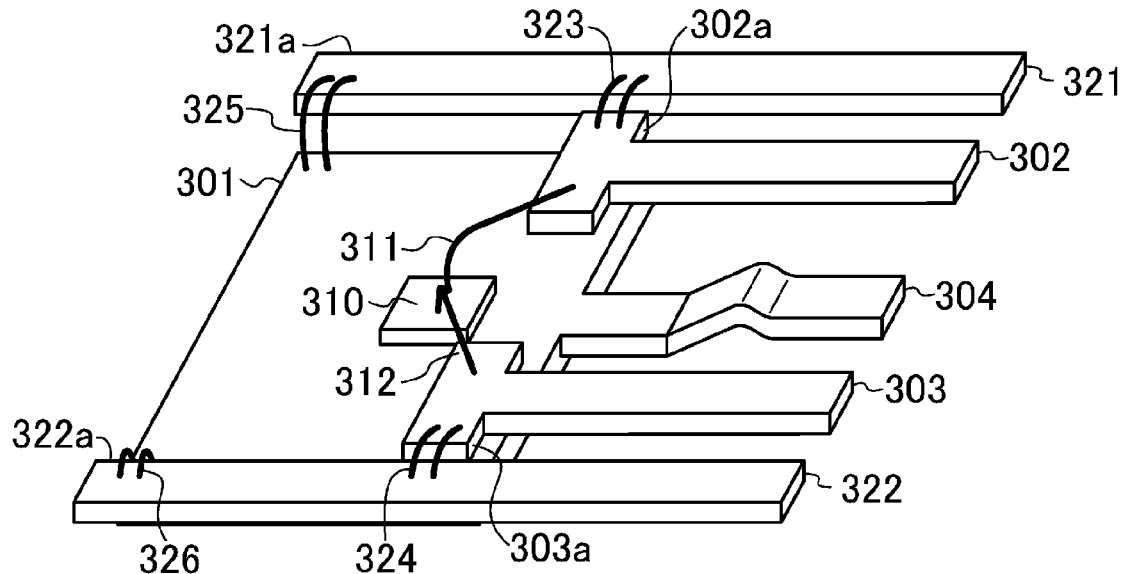
FIG. 31A is a perspective view showing a semiconductor device before resin sealing according to a fourth modification of the fourth embodiment of the present invention.
Figure 31B:
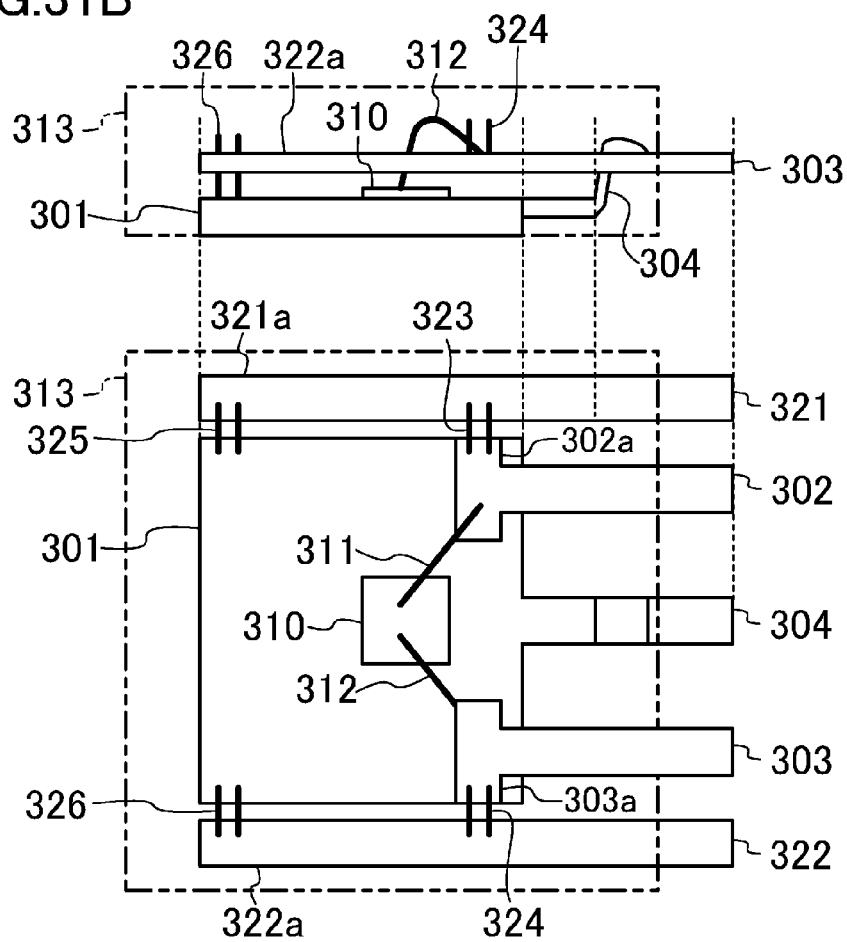
FIG. 31B shows a side view and a plan view of FIG. 31A.
Figure 32A:
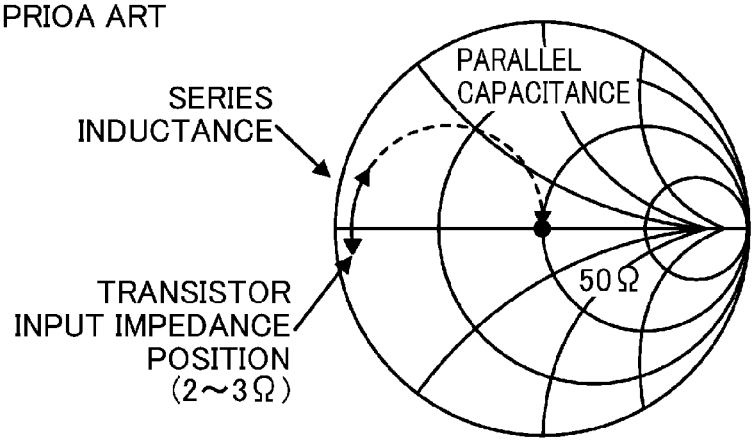
FIGS. 32A-32B are diagrams illustrating 50Ω matching of transistor impedance.
Figure 32B:
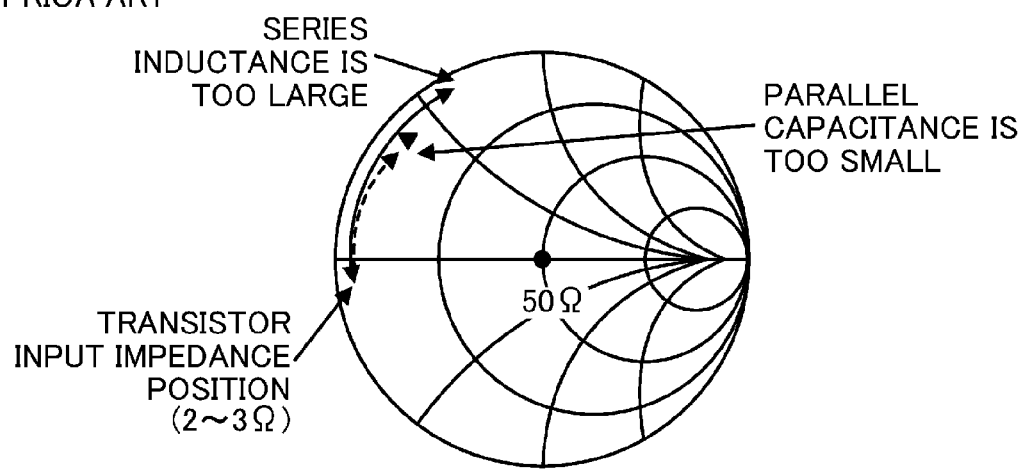
Figure 33A:
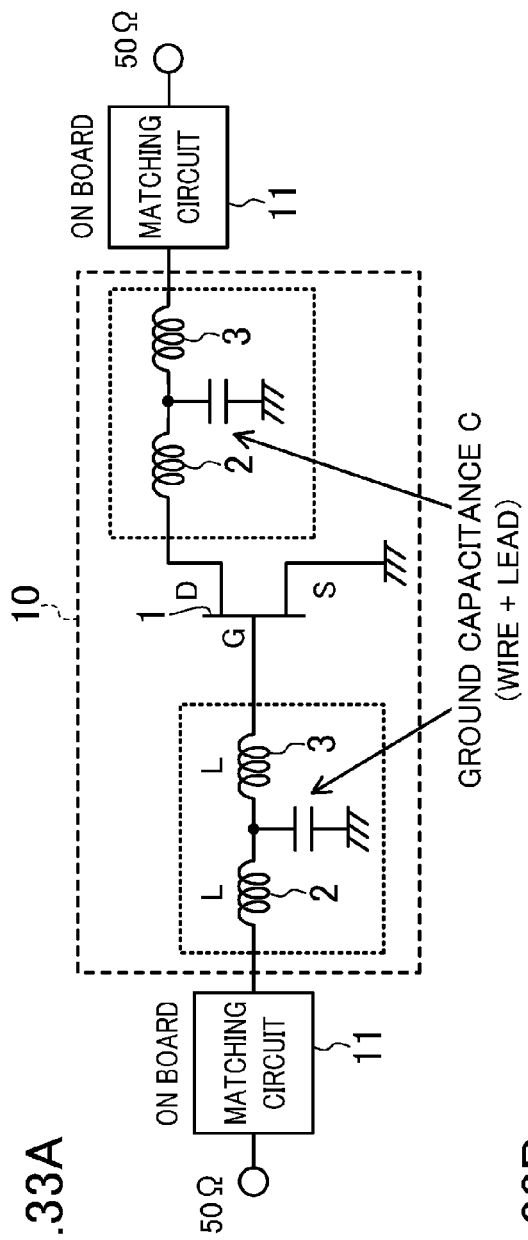
FIG. 33A is a schematic circuit diagram showing a lead and a wire in a resin-sealed package in the form of an equivalent circuit.
Figure 33B:
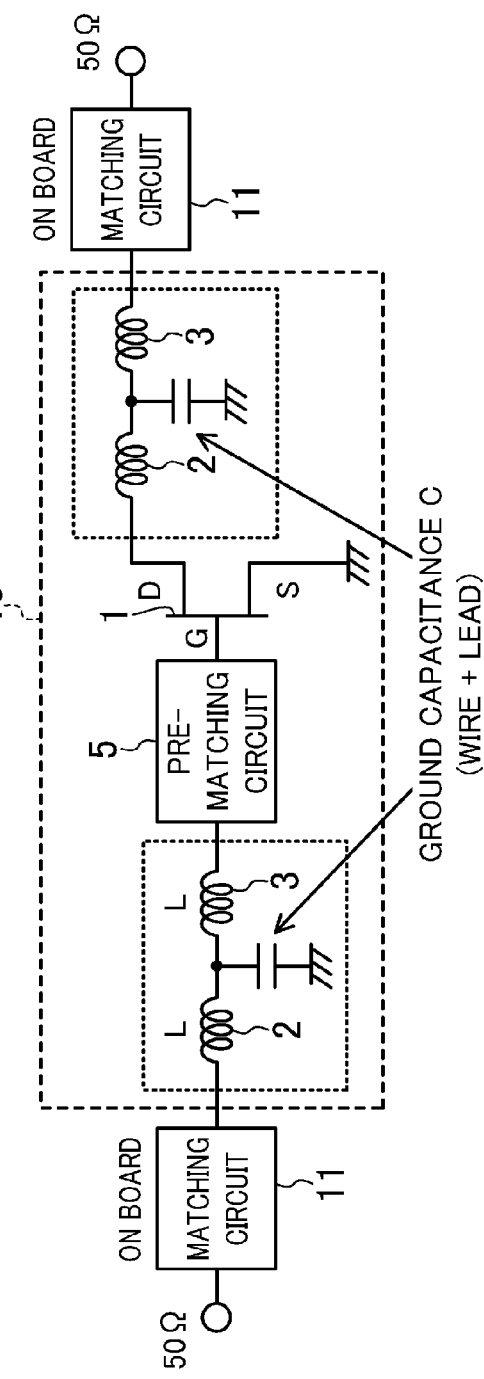
FIG. 33B is a schematic circuit diagram showing a pre-matching circuit in the resin-sealed package.
Figure 34A:
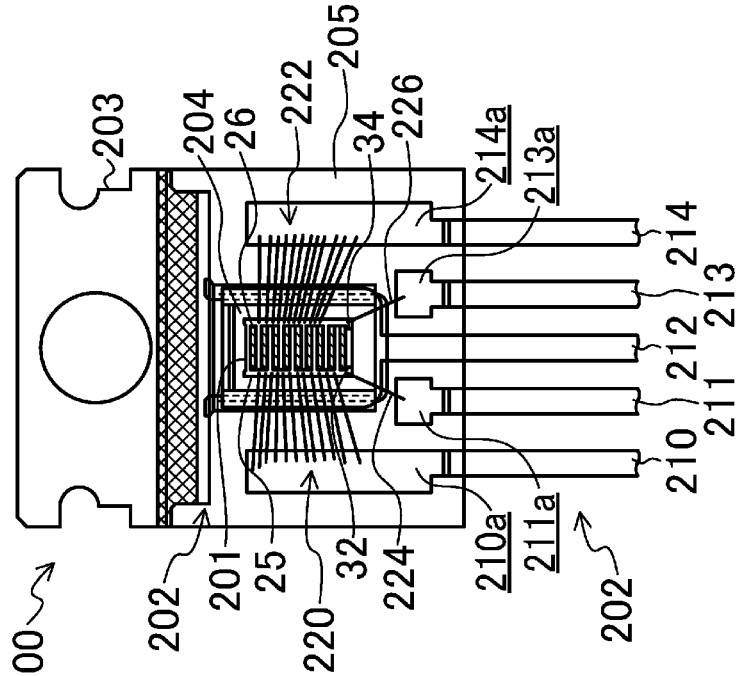
FIGS. 34A-34B are plan views showing semiconductor devices according to first and second conventional examples, respectively.
Figure 34B:
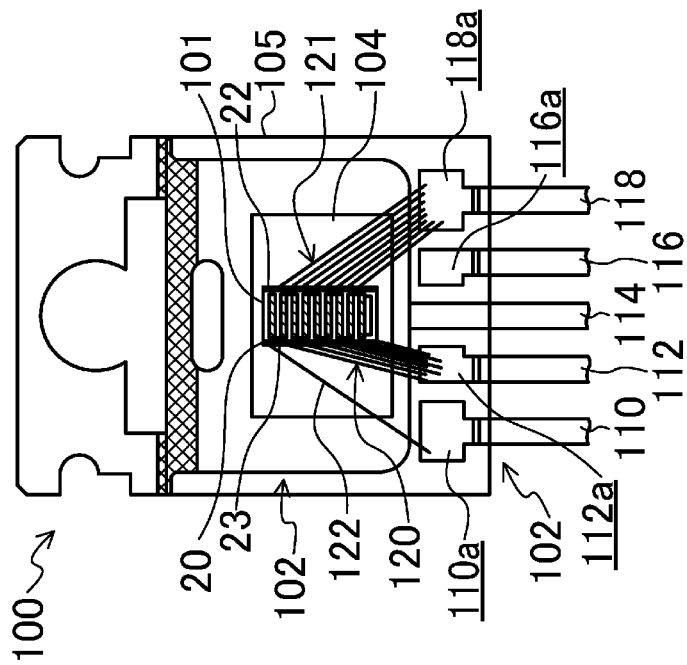
Figure 35A:
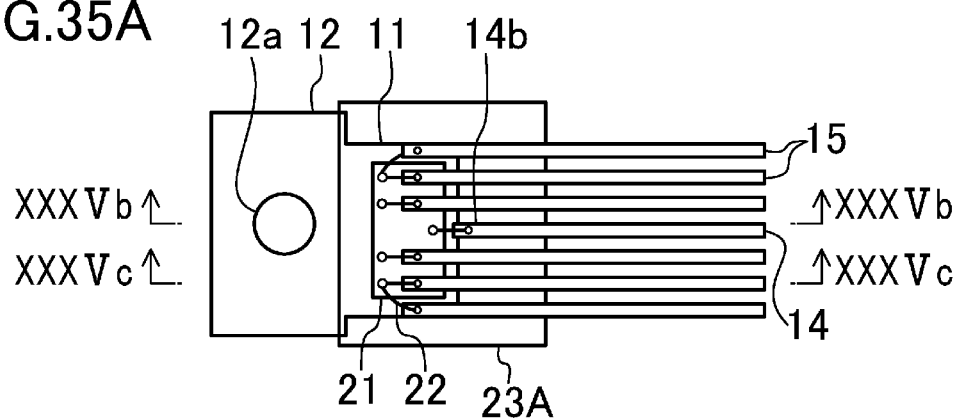
FIGS. 35A-35C show a semiconductor device according to a third conventional example, where
Figure 35B:
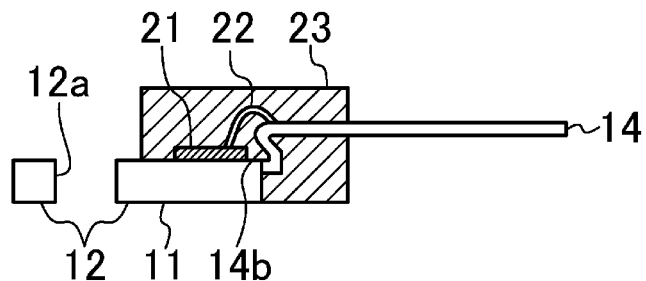
Figure 35C:
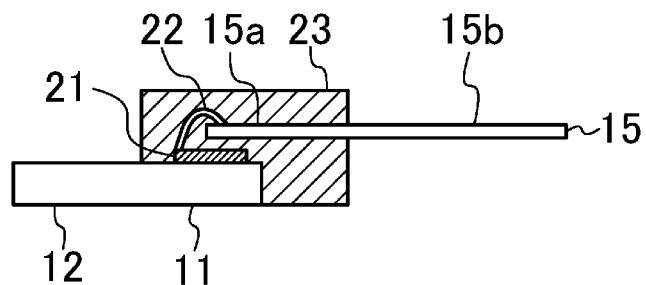

As shown in FIGS. 31A-31B, a lead frame according to the fourth modification is configured so that the lead frame according to the second modification functions as a short-circuited stub (short stub).

Specifically, the end of a first extended portion 321a of the third inner lead 321 and the end of a second extended portion 322a of the fourth inner lead 322 are electrically connected to the die pad 301 by a fifth wire 325 and a sixth wire 326, respectively.

As a package, if the die pad 301 exposed from a sealing resin material is electrically connected to a ground pad on a board in a high frequency circuit section in a system or set by soldering etc., both the first extended portion 321a and the second extended portion 322a have a ground potential. Thus, the first extended portion 321a and the second extended portion 322a function as a short-circuited stub (short stub) of a high frequency distributed constant element.

The operation principle and specific configuration of the short-circuited stub are as described in the third embodiment.

Each of the fifth wire 325 and the sixth wire 326 may be provided at any position on the extended portion 321a, 322a, and similar advantages can be obtained even if the wire is provided at a plurality of positions on the extended portion.

Each of the forms of FIGS. 26A-26B, 28A-28B, 29A-29B, and 30A-30B is applicable even in the case where the entire lead frame is formed by a thin plate member having a uniform thickness of about 0.4 mm to 0.5 mm as in the fifth modification of the first embodiment.

The first to fourth embodiments are described with respect to source grounding of the FET. However, the present invention is also applicable to either drain grounding or gate grounding of the FET depending on the circuit having a semiconductor device.

The present invention is also applicable either in the case where a bipolar transistor is used as the semiconductor chip 310 and the base is grounded, or in the case where a bipolar transistor is used as the semiconductor chip 310 and the emitter or the collector is grounded.

That is, arrangement of the terminals of the semiconductor chip can be determined according to the grounding method of a circuit having a semiconductor device, and the present invention can be applied according to the arrangement of the terminals.

The semiconductor device according to the present invention can implement a semiconductor device having a microwave and millimeter-wave power amplifier capable of increasing output power and performing high gain operation, and is particularly useful as a semiconductor device using a lead frame for a resin-sealed package which is used in a microwave band, etc.

What is claimed is:

1. A semiconductor device, comprising:
   a die pad comprised of a metal, and having at least one cutout portion in its peripheral edge portion, and a protruding portion formed by the cutout portion so as to protrude laterally from the peripheral edge portion;
   a first inner lead having at its end a bonding pad that is placed in the cutout portion with an interval between the bonding, pad and the die pad;
   a semiconductor chip held on the die pad so that a center position of the semiconductor chip is located on the protruding portion side with respect to a center position of the die pad; and
   a wire configured to electrically connect the semiconductor chip to the bonding pad,
   wherein the bonding pad has a first extended portion extending along a side surface of the die pad with an interval therebetween,
   the side surface of the die pad extends from the cutout portion in a first direction,
   the die pad further includes a suspension lead extending from the protruding portion,
   a width of the protruding portion is greater than a width of the suspension lead,
   the semiconductor chip is disposed on at least a portion of the protruding portion, and
   in a plan view, a length of the first extended portion in the first direction is greater than a length of the side surface of the die pad in the first direction.

2. The semiconductor device of claim 1, wherein a ground potential is applied to the die pad, and a capacitive element portion is formed by the first extended portion and the side surface of the die pad.

3. The semiconductor device of claim 1, wherein an upper surface of the die pad and an upper surface of the bonding pad are located at the same height from a lower surface of the die pad, and the die pad has a greater thickness than the first inner lead.

4. The semiconductor device of claim wherein the cutout portion has a planar shape corresponding to two sides of a quadrilateral, one side of a triangle, a concave circular arc, or a convex circular arc.

5. The semiconductor device of claim 1, wherein the suspension lead includes a bent portion.

6. The semiconductor device of claim 1, wherein the first inner lead further includes a second extended portion physically connected to the bonding pad.

7. The semiconductor device of claim 6, wherein the first extended portion extends parallel to the second extended portion in a plan view.

8. The semiconductor device of claim 6, wherein the second extended portion includes a bent portion.

9. The semiconductor device of claim 6, wherein the second extended portion extends from the bonding pad at an intermediate part of the bonding pad.

10. The semiconductor device of claim 6, wherein the die pad further includes a suspension lead extending from the protruding portion.

11. The semiconductor device of claim 10, wherein the suspension lead extends parallel to the second extended portion in a plan view.

12. The semiconductor device of claim 1, wherein the first extended portion functions as an open-circuited stub.

13. The semiconductor device of claim 1, wherein an end of the first extended portion and an end of the die pad arc aligned in a plan view.

14. The semiconductor device of claim 1, wherein the first extended portion has a portion which is thicker than a portion oldie bonding pad placed in the cutout portion.

15. The semiconductor device of claim 1, wherein the bonding pad and the first extended portion form an L-shape in a plan view.

16. The semiconductor device, of claim 1, wherein the bonding pad extends in a first direction in a plan view, and the first extended portion extends in a second direction in a plan view, and the second direction and the first direction are different.

17. A semiconductor device, comprising:
a die pad comprised ala metal, and having at least one cutout portion hi its peripheral edge portion, and a protruding portion formed by the cutout portion;
a first inner lead having a bonding pad that is placed in the cutout portion with an interval between the bonding pad and the die pad;
a semiconductor chip held on the die pad; and
a wire configured to electrically connect the semiconductor chip to the bonding pad,
wherein the bonding pad has a first extended portion extending along a side surface of the die pad with an interval therebetween,
the side surface of the die pad extends from the cutout portion in a first direction, and
in a plain view, a length of the first extended portion in the first direction is greater than a length of the side surface of the die pad in the first direction.

18. The semiconductor device of claim 17, wherein the first inner lead further includes a second extended portion physically connected to the bonding pad.

19. The semiconductor device of claim 18, wherein the second extended portion extends from the bonding pad at an intermediate part of the bonding pad.

20. The semiconductor device of claim 17, wherein the bonding pad extends in a is direction in a plan view, and the first extended portion extends in a second direction in a plan view, and the second direction and the first direction are different.

21. The semiconductor device of claim 17, wherein a center position of the semiconductor chip is located on the protruding portion side with respect to a center position of the die pad.

22. The semiconductor device of claim 17, wherein the die pad further includes a suspension lead extending from the protruding portion, and a width of the protruding portion is greater than a width of the suspension lead.

23. The semiconductor device of claim 17, wherein the semiconductor chip is disposed on at least a portion of the protruding portion.

* * * * *